(12) United States Patent
Lee et al.

(10) Patent No.: US 12,035,604 B2
(45) Date of Patent: Jul. 9, 2024

(54) DISPLAY PANEL AND DISPLAY APPARATUS INCLUDING THE SAME

(71) Applicant: SAMSUNG DISPLAY CO., LTD., Yongin-si (KR)

(72) Inventors: Gihyun Lee, Yongin-si (KR); Byeongguk Choi, Yongin-si (KR); Hwiseong Kim, Yongin-si (KR); Suk Ki, Yongin-si (KR); Youngshin Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 152 days.

(21) Appl. No.: 17/520,423

(22) Filed: Nov. 5, 2021

(65) Prior Publication Data

US 2022/0190063 A1 Jun. 16, 2022

(30) Foreign Application Priority Data

Dec. 14, 2020 (KR) .................. 10-2020-0174724

(51) Int. Cl.
*H01L 51/52* (2006.01)
*H10K 50/84* (2023.01)
*H10K 59/65* (2023.01)

(52) U.S. Cl.
CPC ............. *H10K 59/65* (2023.02); *H10K 50/84* (2023.02)

(58) Field of Classification Search
CPC ...... H10K 59/65; H10K 50/84; H10K 50/816; H10K 50/826; H10K 50/844; H10K 59/126; H10K 59/88; H10K 59/12; H10K 50/805; H10K 50/822; H10K 59/00; H10K 2102/351
See application file for complete search history.

(56) References Cited

U.S. PATENT DOCUMENTS

| | | | |
|---|---|---|---|
| 8,735,876 B2 | 5/2014 | Hwang et al. | |
| 9,905,791 B2 | 2/2018 | Kim et al. | |
| 9,949,336 B2 | 4/2018 | Yoon et al. | |
| 10,079,359 B2 | 9/2018 | Kim et al. | |
| 10,236,464 B2 | 3/2019 | Kim et al. | |
| 2002/0011783 A1* | 1/2002 | Hosokawa | H10K 50/81 313/506 |
| 2006/0208632 A1* | 9/2006 | Kang | H10K 50/84 313/506 |
| 2010/0171107 A1* | 7/2010 | Jung | H10K 59/122 257/40 |
| 2017/0148856 A1* | 5/2017 | Choi | H10K 59/124 |

FOREIGN PATENT DOCUMENTS

| | | |
|---|---|---|
| KR | 10-2016-0024349 | 3/2016 |
| KR | 10-2016-0103596 | 9/2016 |
| KR | 10-2018-0021305 | 3/2018 |
| KR | 10-1846410 | 4/2018 |
| KR | 10-1918712 | 11/2018 |
| KR | 10-2018091 | 8/2019 |

* cited by examiner

*Primary Examiner* — Donald L Raleigh
(74) *Attorney, Agent, or Firm* — F. Chau & Associates, LLC

(57) ABSTRACT

A display panel including a first area and a second area includes a substrate, a first pixel electrode disposed in the first area, and an opposite electrode disposed on the first pixel electrode. The opposite electrode includes a first layer including a first material and a second layer including an alloy including the first material.

23 Claims, 24 Drawing Sheets

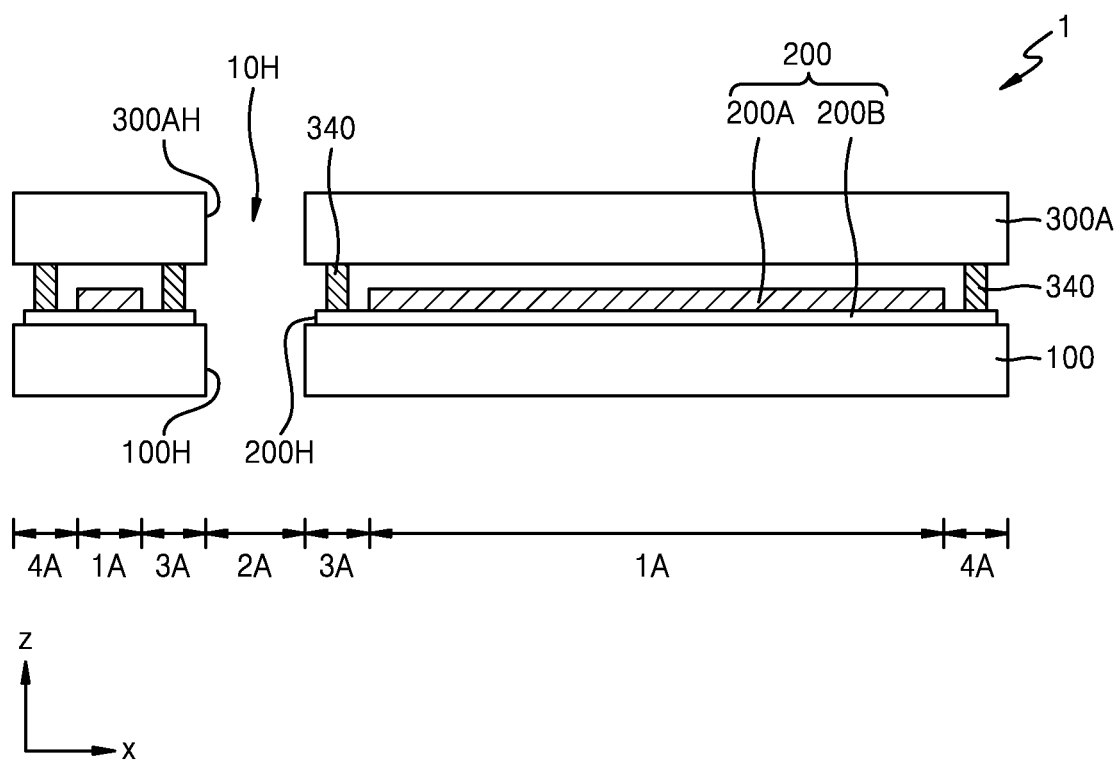

DISPLAY PANEL AND DISPLAY APPARATUS INCLUDING THE SAME

CROSS-REFERENCE TO RELATED APPLICATIONS

This application is based on and claims priority under 35 U.S.C. § 119 to Korean Patent Application No. 10-2020-0174724, filed on Dec. 14, 2020 in the Korean Intellectual Property Office, the disclosure of which is incorporated by reference herein in its entirety.

TECHNICAL FIELD

Embodiments of the present disclosure relate to a display panel and a display apparatus including the same, and more particularly, to a display panel in which a display area is expanded to allow an image to be displayed even in an area in which a component (e.g., an electronic element) is arranged, and a display apparatus including the display panel.

DISCUSSION OF RELATED ART

As technology advances, the use of display apparatuses is expanding, and display apparatuses have become thinner and more lightweight.

Various methods may be used to design the shapes of such display apparatuses, and the number of functions that may be added or linked to such display apparatuses is increasing as the use of such display apparatuses expands.

SUMMARY

Embodiments of the present disclosure include a display panel in which a display area is expanded to allow an image to be displayed even in an area in which an electronic component (e.g., an electronic element) is arranged, and a display apparatus including the same.

According to an embodiment, a display panel including a first area and a second area includes a substrate, a first pixel electrode disposed on the first area, and an opposite electrode disposed on the first pixel electrode. The opposite electrode includes a first layer including a first material and a second layer including an alloy including the first material.

In an embodiment, the opposite electrode may have a thickness of about 50 Å to about 150 Å.

In an embodiment, a thickness of the first layer may be about 1/10 to about 4/5 of the thickness of the opposite electrode.

In an embodiment, a thickness of the second layer may be about 1/5 to about 9/10 of the thickness of the opposite electrode.

In an embodiment, the first layer may include only a single material.

In an embodiment, the alloy may include the first material and a second material, and an amount of the second material may be about 5% to about 40% of a total amount of the second layer.

In an embodiment, the first material may have a ductility greater than that of the second material, and the second material may have a brittleness greater than that of the first material.

In an embodiment, the first layer may be closer to the substrate than the second layer is to the substrate.

In an embodiment, an amount of the second material in the second layer may gradually increase from a bottom of the second layer to a top of the second layer.

In an embodiment, the second layer may be closer to the substrate than the first layer is to the substrate.

In an embodiment, an amount of the second material in the second layer may gradually decrease from a bottom of the second layer to a top of the second layer.

In an embodiment, the alloy may include the first material and a second material.

In an embodiment, an amount of the second material in the second layer may gradually increase from a bottom of the second layer to a top of the second layer.

In an embodiment, an amount of the second material in the second layer may gradually decrease from a bottom of the second layer to a top of the second layer.

In an embodiment, the display panel may further include a third area disposed between the first area and the second area, and a through hole may be defined in the second area.

In an embodiment, the opposite electrode may extend from the first area to the third area.

In an embodiment, the display panel may further include a second pixel electrode disposed in the second area. The opposite electrode may extend from the first area to the second area and cover the second pixel electrode.

In an embodiment, the display panel may further include a bottom metal layer disposed between the substrate and the opposite electrode in the second area.

In an embodiment, the second area may include a transmission area, and the bottom metal layer may include a lower hole corresponding to the transmission area.

In an embodiment, the opposite electrode may include a hole corresponding to the transmission area.

In an embodiment, the display panel may further include an organic functional layer disposed between the second pixel electrode and the opposite electrode, and a thin-film encapsulation layer disposed on the opposite electrode.

According to an embodiment, a display apparatus includes a display panel including a first area and a second area, and a component disposed below the display panel and corresponding to the second area. The display panel includes a substrate, a first pixel electrode disposed in the first area, and an opposite electrode disposed on the first pixel electrode. The opposite electrode includes a first layer including a first material and a second layer including an alloy including the first material.

In an embodiment, the opposite electrode may have a thickness of about 50 Å to about 150 Å.

In an embodiment, the first layer may include a single material, and a thickness of the first layer may be about 1/10 to about 4/5 of the thickness of the opposite electrode.

In an embodiment, a thickness of the second layer may be about 1/5 to about 9/10 of the thickness of the opposite electrode.

In an embodiment, the alloy may include the first material and a second material, and an amount of the second material may be about 5% to about 40%.

In an embodiment, the first material may have a ductility greater than that of the second material, and the second material may have a brittleness greater than that of the first material.

In an embodiment, the alloy may include the first material and a second material, and an amount of the second material in the second layer may gradually increase or decrease from a bottom of the second layer to a top of the second layer.

In an embodiment, the display apparatus may further include a third area disposed between the first area and the second area, and a through hole may be defined in the second area.

In an embodiment, the component may include an imaging element or a sensor.

BRIEF DESCRIPTION OF THE DRAWINGS

The above and other features of the disclosure will become more apparent by describing in detail embodiments thereof with reference to the accompanying drawings, in which:

FIGS. 4A to 4D are schematic cross-sectional views of a display apparatus according to an embodiment;

DETAILED DESCRIPTION

Figure 1:
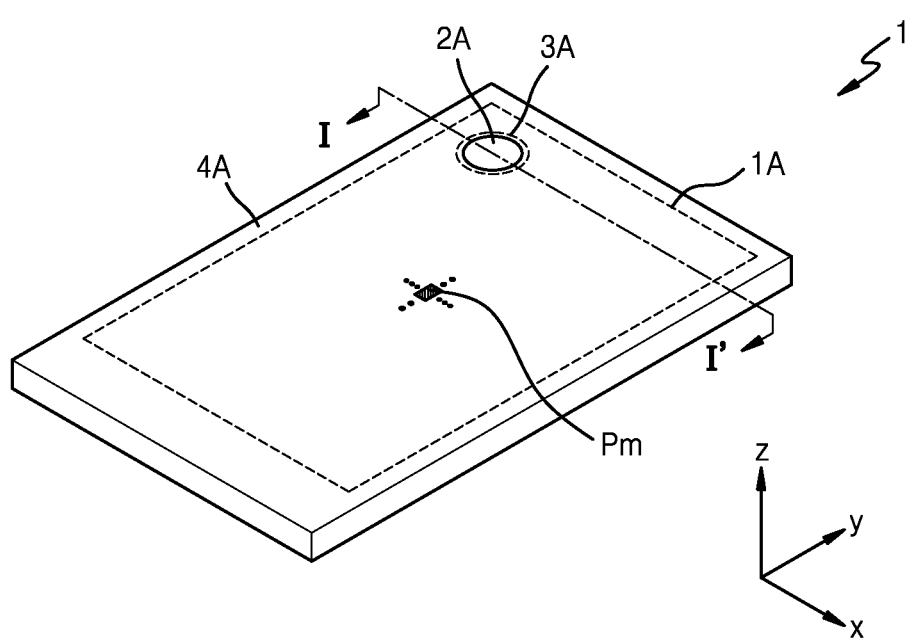
FIG. 1 is a schematic perspective view of a display apparatus according to an embodiment.

Embodiments of the present disclosure will be described more fully hereinafter with reference to the accompanying drawings. Like reference numerals may refer to like elements throughout the accompanying drawings.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various elements, these elements should not be limited by these terms. These terms are only used to distinguish one element from another. Thus, a "first" element in an embodiment may be described as a "second" element in another embodiment.

The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Other words used to describe the relationships between components should be interpreted in a like fashion.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

In the following description, the expression "a line extends in a first direction or a second direction" may include a case in which "a line extends in a linear shape" and a case in which "a line extends in a zigzag or curved shape in a first direction or a second direction".

In the following description, the term "in a plan view" means viewing a target portion from above, and the term "in a cross-sectional view" means viewing a vertically cut cross-section of a target portion from a side. In the following description, the term "overlapping" may include overlapping "in a plan view" and "in a cross-sectional view."

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a schematic perspective view of a display apparatus 1 according to an embodiment.

Referring to FIG. 1, the display apparatus 1 may include a first area 1A and a second area 2A disposed within the first area 1A. The first area 1A may partially surround the second area 2A. Main pixels Pm may be disposed in the first area 1A. The display apparatus 1 may provide a certain image by using light emitted from the main pixels Pm disposed in the first area 1A. According to an embodiment, a display element may be disposed in the first area 1A.

Figure 2A:
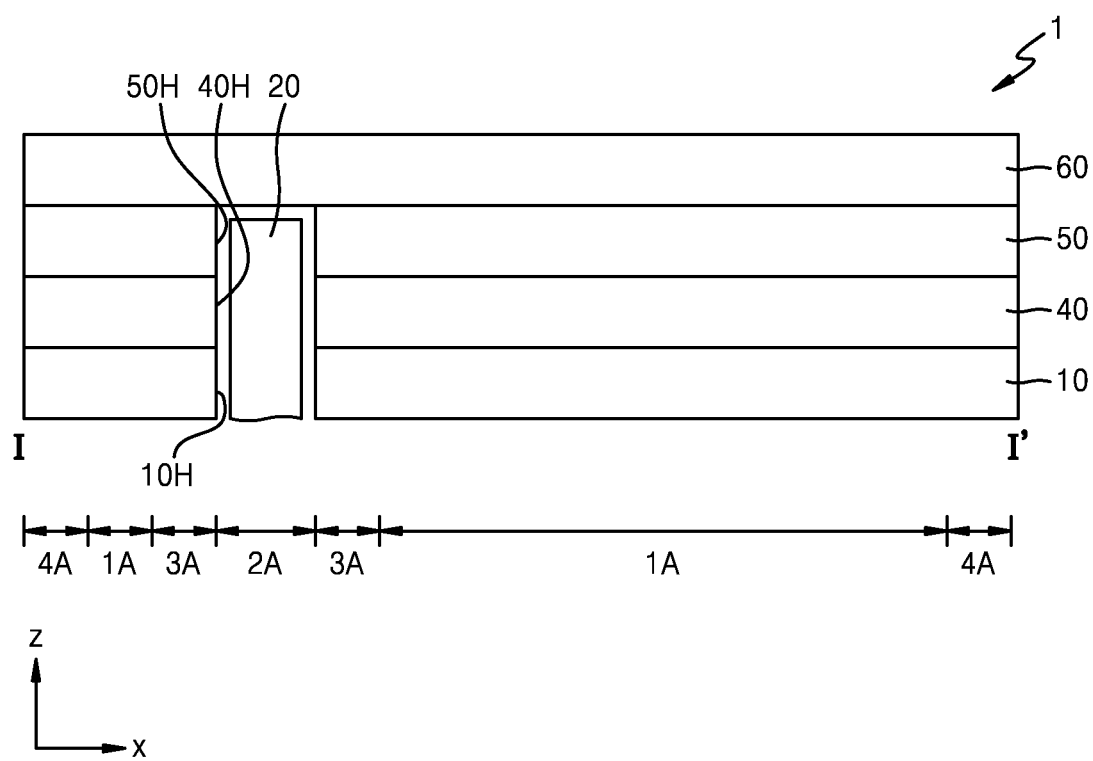
FIGS. 2A and 2B are schematic cross-sectional views of a display apparatus according to an embodiment.

FIG. 1 illustrates an embodiment in which one second area 2A is disposed inside the first area 1A, and in which the second area 2A is completely surrounded by the first area 1A. The second area 2A may be an area in which a component 20 to be described later with reference to FIG. 2A is arranged.

A third area 3A may be disposed between the first area 1A and the second area 2A, and the first area 1A may be surrounded by a fourth area 4A. The third area 3A and the fourth area 4A may each be a non-display area in which pixels are not arranged and an image is not displayed. The third area 3A may be completely surrounded by the first area 1A, and the first area 1A may be completely surrounded by the fourth area 4A.

Hereinafter, according to an embodiment, an organic light-emitting display apparatus will be described as an example of the display apparatus 1. However, the display apparatus is not limited thereto. For example, according to an embodiment, a display apparatus such as a quantum dot light-emitting display may be used.

FIG. 1 illustrates that one second area 2A is provided in a circular shape. However, embodiments of the disclosure are not limited thereto. For example, according to embodiments, the number of second areas 2A may be two or more, and the shape of each of the second areas 2A may be variously changed. For example, each of the second areas 2A may have a circular shape, an elliptical shape, a polygonal shape, a star shape, or a diamond shape.

Figure 2B:
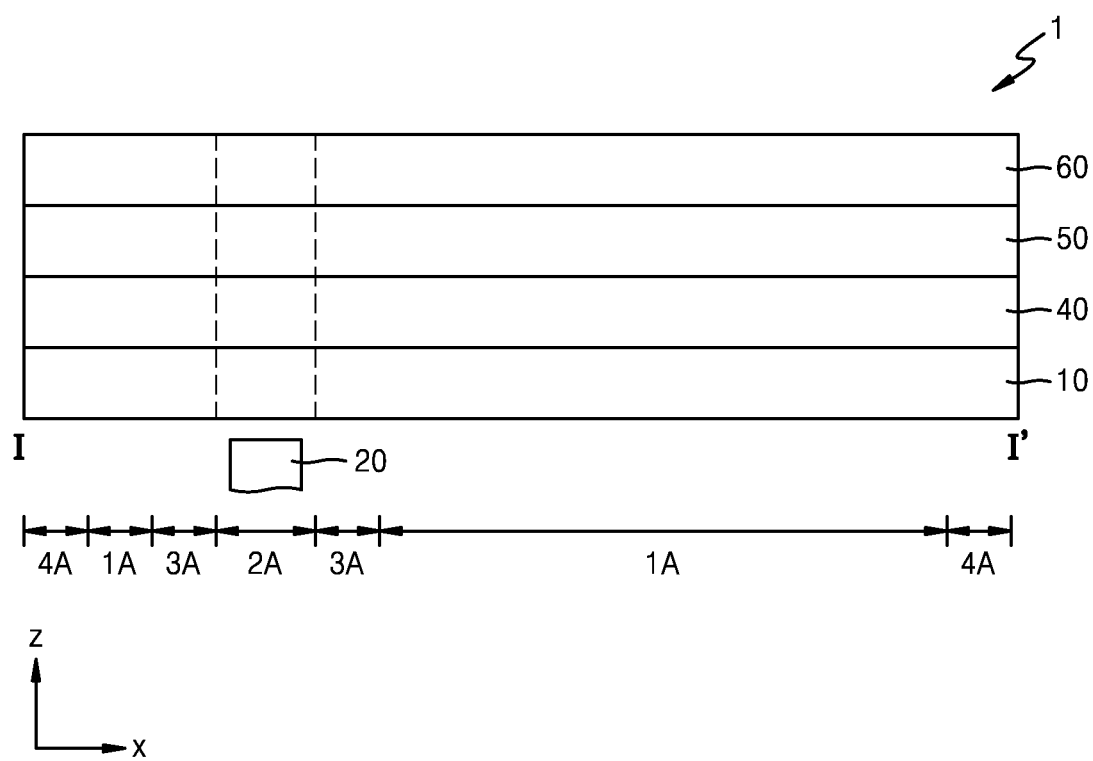

FIGS. 2A and 2B are schematic cross-sectional views of the display apparatus 1 according to an embodiment. FIGS. 2A and 2B are cross-sectional views of the display apparatus 1 taken along line I-I' of FIG. 1, according to an embodiment.

Referring to FIGS. 2A and 2B, the display apparatus 1 may include a display panel 10, and an input sensing layer 40 and an optical functional layer 50, which are disposed on the display panel 10. The display panel 10, the input sensing layer 40, and the optical functional layer 50 may be covered by a window 60. The display apparatus 1 may include various types of electronic apparatuses such as, for example, mobile phones, laptop computers, and smart watches.

The display panel 10 may include main pixels Pm (see FIG. 1) disposed in the first area 1A. The main pixels Pm may include a display element and a pixel circuit connected thereto. The display element may include, for example, an organic light-emitting diode, a quantum dot organic light-emitting diode, or the like. The display panel 10 may display an image through the main pixels Pm disposed in the first area 1A.

The input sensing layer 40 may be disposed on the display panel 10. For example, the input sensing layer 40 may be directly disposed on the display panel 10 such that the input sensing layer 40 directly contacts the display panel 10. The input sensing layer 40 may obtain coordinate information according to an external input, for example, a touch event. The input sensing layer 40 may include a sensing electrode (or a touch electrode) and trace lines electrically connected to the sensing electrode. The input sensing layer 40 may be disposed above the display panel 10. The input sensing layer 40 may sense an external input by using a mutual capacitance method and/or a self capacitance method.

The input sensing layer 40 may be formed directly on the display panel 10, or may be separately formed and then bonded through an adhesive layer such as an optical clear adhesive. For example, in an embodiment, the input sensing layer 40 may be continuously formed after a process of forming the display panel 10. In this case, the input sensing layer 40 may be understood as being a portion of the display panel 10. In an embodiment, the adhesive layer is not disposed between the input sensing layer 40 and the display panel 10. Although FIG. 2A illustrates that the input sensing layer 40 is disposed between the display panel 10 and the optical functional layer 50, in an embodiment, the input sensing layer 40 may be disposed above the optical functional layer 50.

The optical functional layer 50 may be disposed on the input sensing layer 40. The optical functional layer 50 may include an anti-reflective layer. The anti-reflective layer may reduce reflectance of light (external light) incident from outside of the display apparatus 1 toward the display panel 10 through the window 60. The anti-reflective layer may include a retarder and a polarizer. The retarder may be a film-type retarder or a liquid crystal coating-type retarder and may include a $\lambda/2$ retarder and/or a $\lambda/4$ retarder. The polarizer may be a film-type polarizer or a liquid crystal coating-type polarizer. The film-type polarizer may include a stretched synthetic resin film, and the liquid crystal coating-type polarizer may include liquid crystals arranged in a certain array. Each of the retarder and the polarizer may further include a protective film. The protective film of each of the retarder and the polarizer may be defined as a base layer of the anti-reflective layer.

According to an embodiment, the anti-reflective layer may include a black matrix and color filters. The color filters may be arranged taking into consideration the color of light emitted from each main pixel Pm of the display panel 10. According to an embodiment, the anti-reflective layer may include a destructive interference structure. The destructive interference structure may include a first reflective layer and a second reflective layer, which are disposed on different layers from each other. First reflected light and second reflected light, which are respectively reflected from the first reflective layer and the second reflective layer, may destructively interfere with each other. Thus, reflectance of external light may be reduced.

The optical functional layer 50 may include a lens layer. The lens layer may increase light emission efficiency of light emitted from the display panel 10, or may reduce color deviation. The lens layer may include a layer having a concave or convex lens shape, and/or may include a plurality of layers having different refractive indices from each other.

The optical functional layer 50 may include either or both of the anti-reflective layer and the lens layer described above.

According to an embodiment, the optical functional layer 50 may be continuously formed after a process of forming the display panel 10 and/or the input sensing layer 40. In this case, in an embodiment, an adhesive layer is not disposed between the optical functional layer 50, the display panel 10, and/or the input sensing layer 40.

Each of the display panel 10, the input sensing layer 40, and/or the optical functional layer 50 may include an opening (a hole or a through hole). In this regard, FIG. 2A illustrates that the display panel 10, the input sensing layer 40, and the optical functional layer 50 include openings 10H, 40H, and 50H, respectively, and the openings 10H, 40H, and 50H overlap each other. The openings 10H, 40H, and 50H may be positioned to correspond to the second area 2A.

According to an embodiment, one or more of the display panel 10, the input sensing layer 40, and the optical functional layer 50 does not include an opening. For example, in an embodiment, at least one of the display panel 10, the input sensing layer 40, or the optical functional layer 50 does not include an opening. Alternatively, as illustrated in FIG. 2B, in an embodiment, the display panel 10, the input sensing layer 40, and the optical functional layer 50 all do not include an opening.

The second area 2A may be a component area (e.g., a sensor area, a camera area, a speaker area, etc.) in which a component 20 for adding various functions to the display apparatus 1 is positioned. As illustrated in FIG. 2A, the component 20 may be positioned within the openings 10H, 40H, and 50H. Alternatively, as illustrated in FIG. 2B, the component 20 may be disposed below the display panel 10.

The component 20 may include an electronic element. For example, the component 20 may include an electronic element using light or sound. For example, the electronic element may include a sensor (e.g., an infrared sensor) that outputs and/or receives light, a camera that receives light to capture an image, a sensor that measures a distance or recognizes a fingerprint by outputting and sensing light or sound, a small lamp that outputs light, a speaker that outputs sound, and the like. An electronic element using light may use light of various wavelength bands such as, for example, visible light, infrared light, and ultraviolet light. According to an embodiment, the second area 2A may be a transmission area through which light and/or sound that is output from the component 20 to outside of the display apparatus 1 or directed from outside of the display apparatus 1 to the electronic element may be transmitted.

According to an embodiment, when the display apparatus 1 is used as a smart watch or a dashboard for a vehicle, the component 20 may include a member including a clock hand or a needle indicating certain information (e.g., vehicle velocity, etc.). When the display apparatus 1 includes a clock hand or a dashboard for a vehicle, the component 20 may be exposed to outside of the display apparatus 1 through the window 60, and the window 60 may include an opening corresponding to the second area 2A.

The component 20 may include element(s) related to the functions of the display panel 10 as described above, or may include element(s) such as accessories that increase the aesthetic appeal of the display panel 10. In some embodiments, an optical clear adhesive or the like may be disposed between the window 60 and the optical functional layer 50.

FIGS. 3A to 3D are schematic cross-sectional views of the display apparatus 1 according to an embodiment.

Figure 3A:
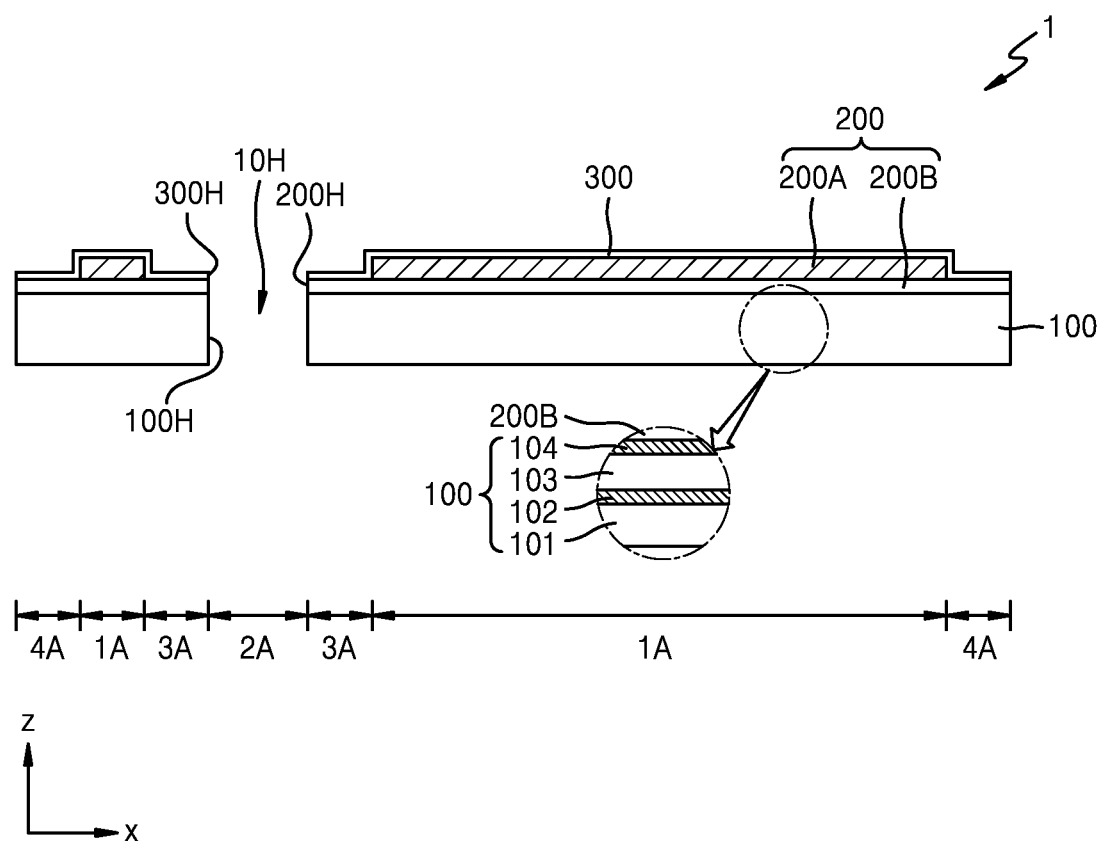
FIGS. 3A to 3D are schematic cross-sectional views of a display apparatus according to an embodiment.

Referring to FIG. 3A, the display apparatus 1 may include a display layer 200 disposed on a substrate 100. The substrate 100 may include a glass material or a polymer resin. The substrate 100 may be formed with multiple layers. For example, the substrate 100 may include a first base layer 101, a first barrier layer 102, a second base layer 103, and a second barrier layer 104.

Each of the first base layer 101 and the second base layer 103 may include a polymer resin. For example, each of the first base layer 101 and the second base layer 103 may include a polymer resin such as polyethersulfone, polyarylate, polyether imide, polyethylene naphthalate, polyethylene terephthalate, polyphenylene sulfide, polyimide, polycarbonate, cellulose triacetate, or cellulose acetate propionate. The above-described polymer resin may be transparent.

The first barrier layer 102 and the second barrier layer 104 may prevent or reduce infiltration of external foreign matter, and may include a single layer or multiple layers including an inorganic material such as silicon nitride ($SiN_x$) or silicon oxide ($SiO_x$).

The display layer 200 may include main pixels Pm (see FIG. 1). The display layer 200 may include a display element layer 200A including display elements arranged for each main pixel Pm, and a pixel circuit layer 200B including a pixel circuit and insulating layers arranged for each main pixel Pm. Each pixel circuit may include a thin-film transistor and a storage capacitor, and each display element may include an organic light-emitting diode (OLED).

The display elements of the display layer 200 may be covered with an encapsulation member such as a thin-film encapsulation layer 300. The thin-film encapsulation layer 300 may include at least one inorganic layer and at least one organic layer. When the display apparatus 1 includes the substrate 100 including a polymer resin and the thin-film encapsulation layer 300 including at least one inorganic encapsulation layer and at least one organic encapsulation layer, the flexibility of the display apparatus 1 may be increased.

The display apparatus 1 may include an opening 10H passing through the display panel 10. The opening 10H may be positioned in the second area 2A. In this case, the second area 2A may be an opening area. FIG. 3A illustrates that the substrate 100 and the thin-film encapsulation layer 300 include through holes 100H and 300H corresponding to the opening 10H of the display panel 10. For example, in an embodiment, the opening 10H may include the through holes 100H and 300H. The display layer 200 may also include a through hole 200H corresponding to the second area 2A.

Figure 3B:
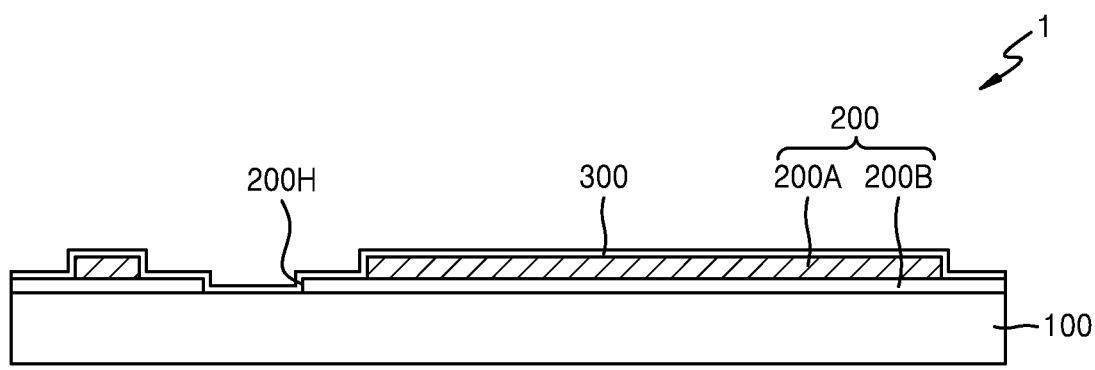

According to an embodiment, as illustrated in FIG. 3B, the substrate 100 does not include a through hole corresponding to the second area 2A, the display layer 200 may include a through hole 200H corresponding to the second area 2A, and the thin-film encapsulation layer 300 does not include a through hole corresponding to the second area 2A.

Figure 3C:
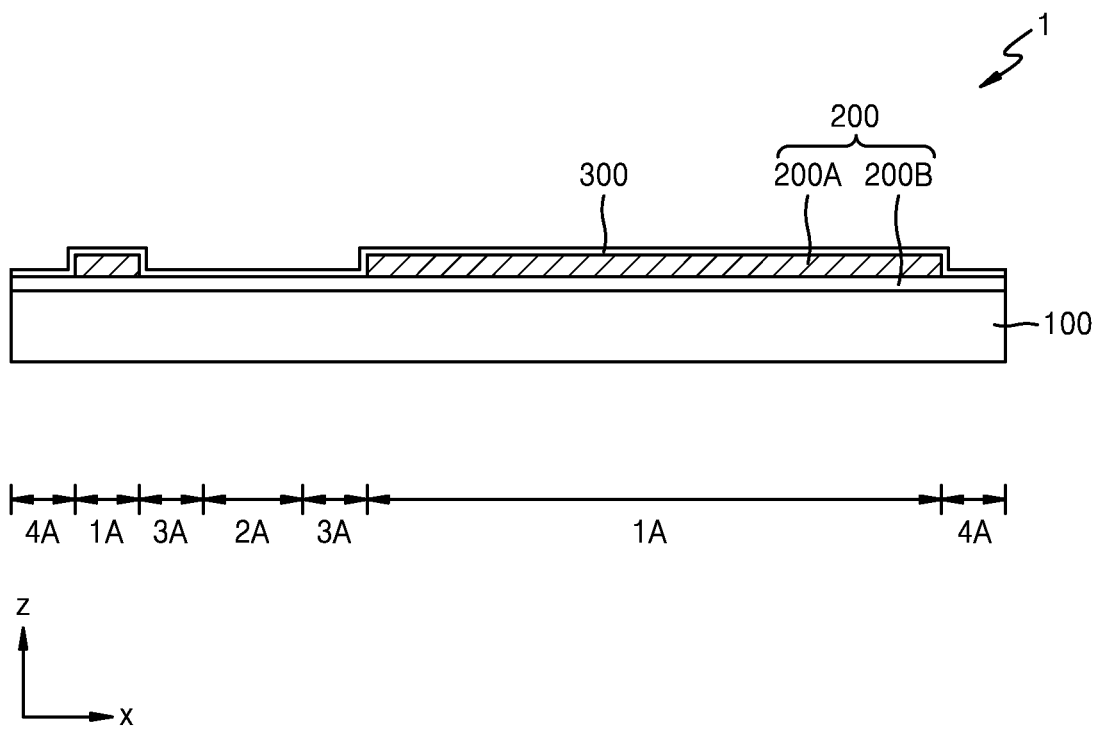

According to an embodiment, as illustrated in FIG. 3C, the pixel circuit layer 200B does not include a through hole 200H corresponding to the second area 2A, and the display element layer 200A does include a through hole 200H and is not arranged in the second area 2A.

Figure 3D:
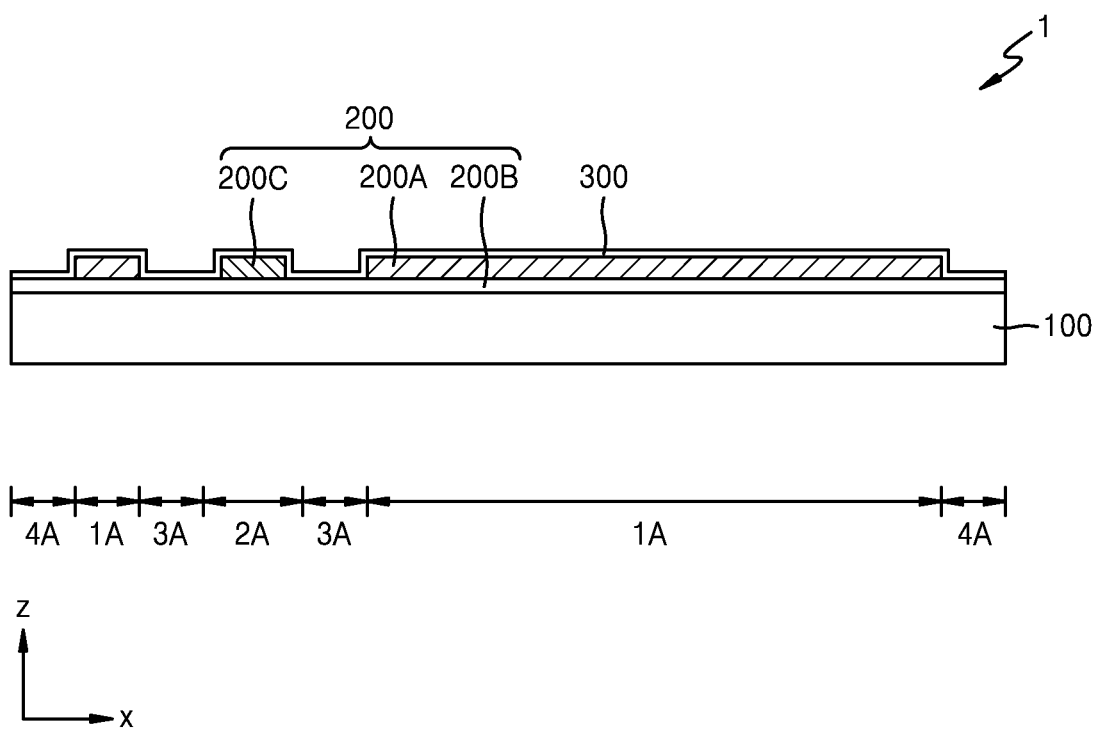

Although FIGS. 3A to 3C illustrate an embodiment in which the display element layer 200A is not arranged in the second area 2A, embodiments of the disclosure are not limited thereto. For example, according to an embodiment, as illustrated in FIG. 3D, an auxiliary display element layer 200C may be arranged in the second area 2A. In an embodiment, the auxiliary display element layer 200C may include a display element having the same structure as the display element of the display element layer 200A and operating in the same manner as the display element of the display element layer 200A. In an embodiment, the auxiliary display element layer 200C may include a display element having a structure different from the display element of the display element layer 200A and operating in a manner different from the display element of the display element layer 200A.

According to an embodiment, main pixels Pm of the display element layer 200A may include active organic light-emitting diodes, and main pixels Pm of the auxiliary display element layer 200C may include passive organic light-emitting diodes. When the auxiliary display element layer 200C includes passive organic light-emitting diodes as a display element, elements constituting a pixel circuit are not present under the passive organic light-emitting diodes in an embodiment. For example, a portion of the pixel circuit layer 200B under the auxiliary display element layer 200C does not include a thin-film transistor and a storage capacitor in an embodiment.

According to an embodiment, the auxiliary display element layer 200C may include a display element (e.g., an active organic light-emitting diode) having the same type as the display element layer 200A, but the structures of the pixel circuits thereunder may be different from each other. For example, the pixel circuit disposed under the auxiliary display element layer 200C (e.g., a pixel circuit having a light shielding layer between the substrate and the thin-film transistor) may have a structure different from that of the pixel circuit disposed under the display element layer 200A. Alternatively, the display elements of the auxiliary display element layer 200C may operate according to a control signal different from that of the display elements of the display element layer 200A. For example, a component that does not require a relatively high transmittance (e.g., an infrared sensor) may be arranged in the second area 2A in which the auxiliary display element layer 200C is arranged. In this case, the second area 2A may be a component area and an auxiliary display area.

FIGS. 4A to 4D are schematic cross-sectional views of the display apparatus 1 according to an embodiment.

While the display apparatus 1 described above with reference to FIGS. 3A to 3D includes the thin-film encapsulation layer 300, the display apparatus 1 of FIGS. 4A to 4D includes an encapsulation substrate 300A and a sealant 340.

According to an embodiment, the encapsulation substrate 300A may face a substrate 100 and may be bonded to the substrate 100 in a third area 3A and a fourth area 4A by the sealant 340. Alternatively, the encapsulation substrate 300A may be bonded to the substrate 100 by a sealing member such as a frit.

Figure 4B:
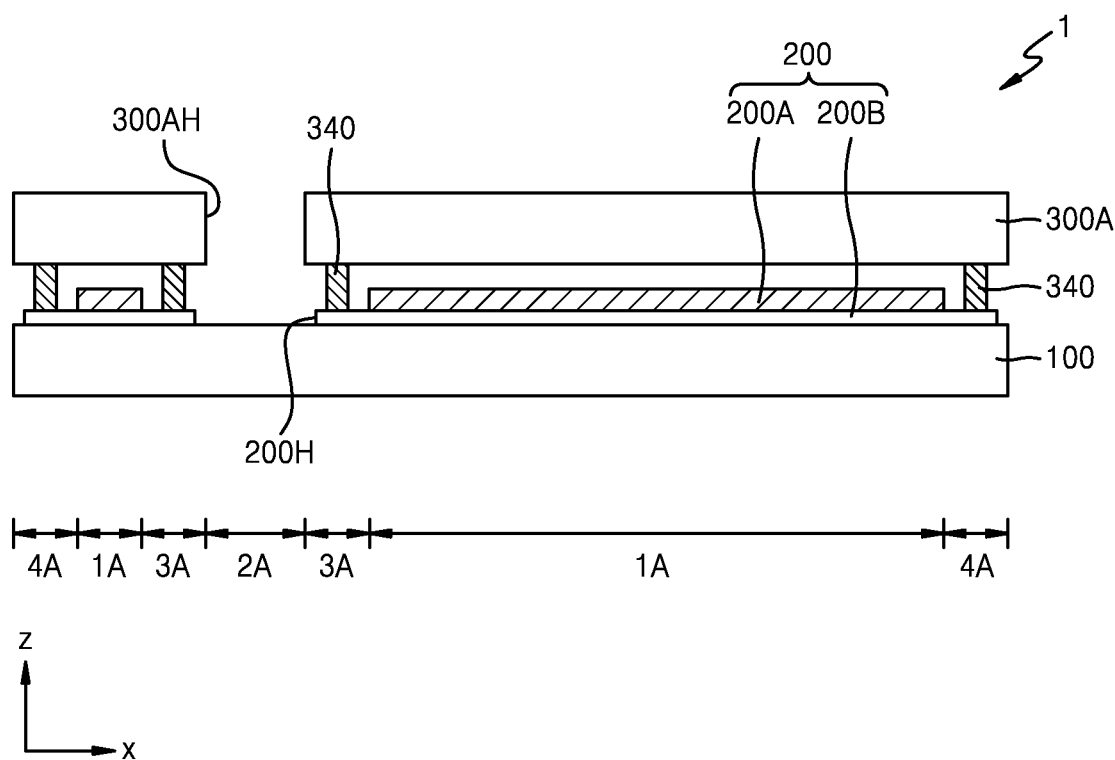
Figure 4C:
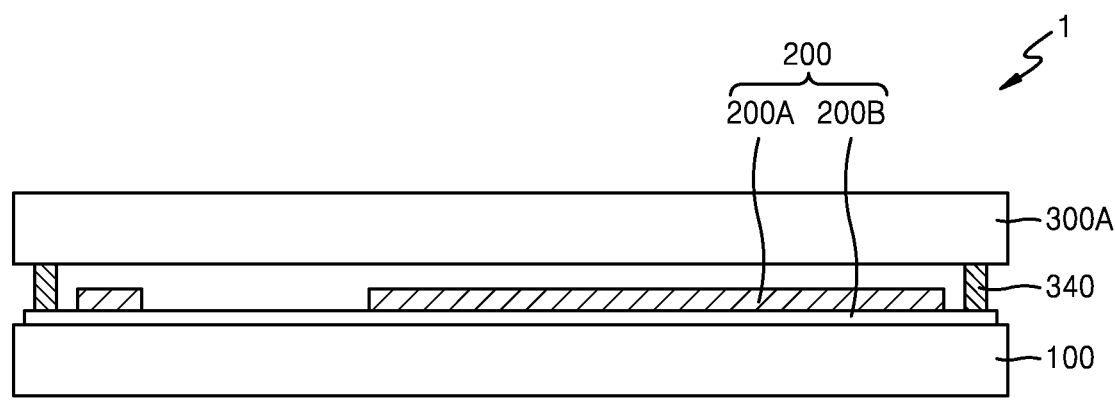
Figure 4D:
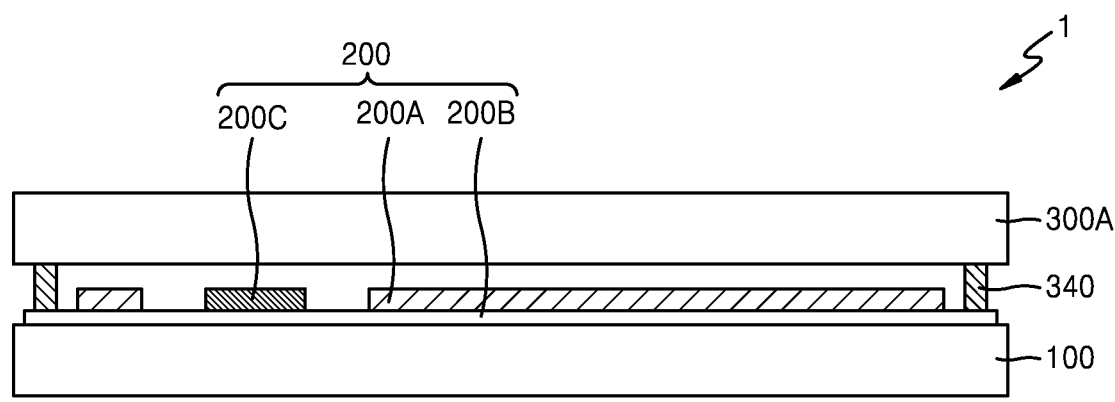

As illustrated in FIGS. 4A to 4C, one or more of the substrate 100, a display layer 200, and the encapsulation substrate 300A may include through holes 100H, 200H, and 300AH corresponding to a second area 2A. In some embodiments, a display element layer 200A is not arranged in the second area 2A, or an auxiliary display element layer 200C may be arranged as illustrated in FIG. 4D. The auxiliary display element layer 200C is the same as described above with reference to FIG. 3D.

Figure 5:
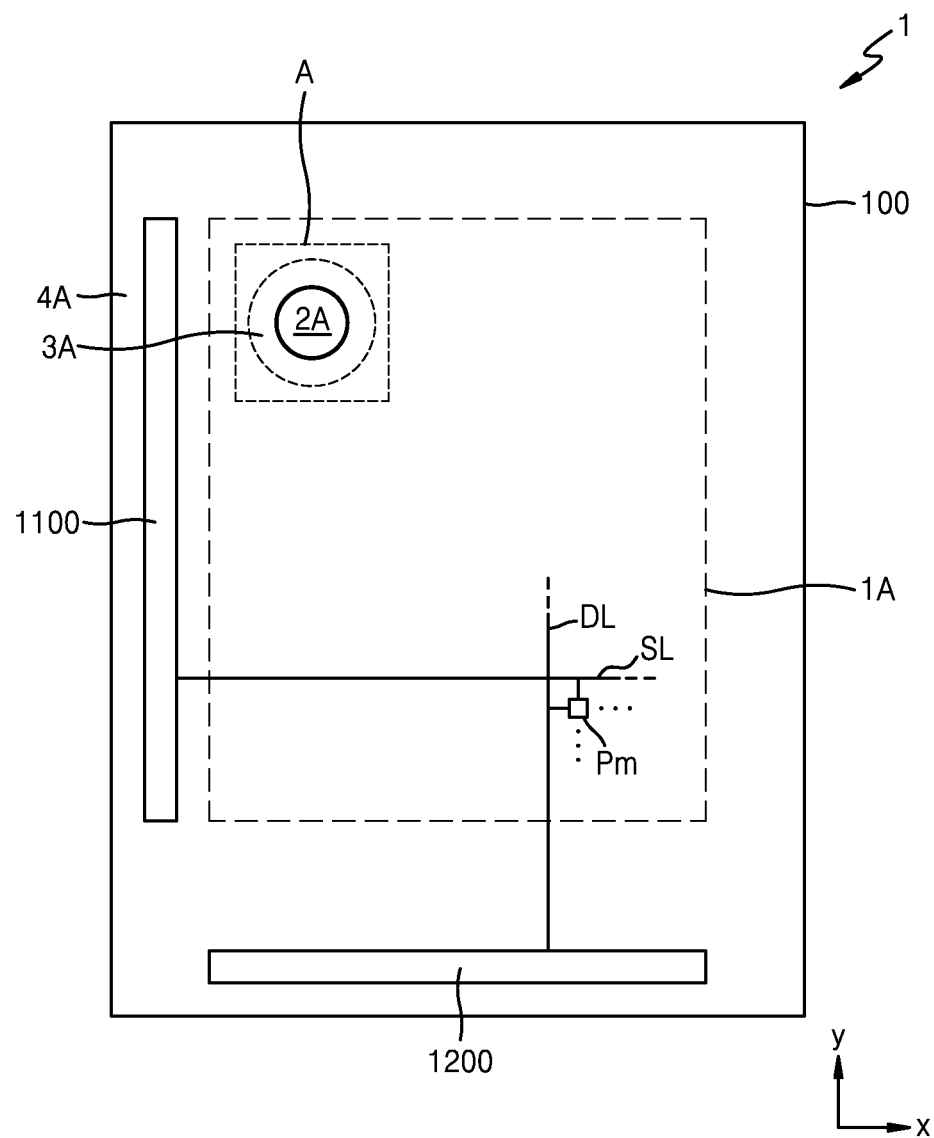
FIG. 5 is a schematic plan view of a display apparatus according to an embodiment.
Figure 6:
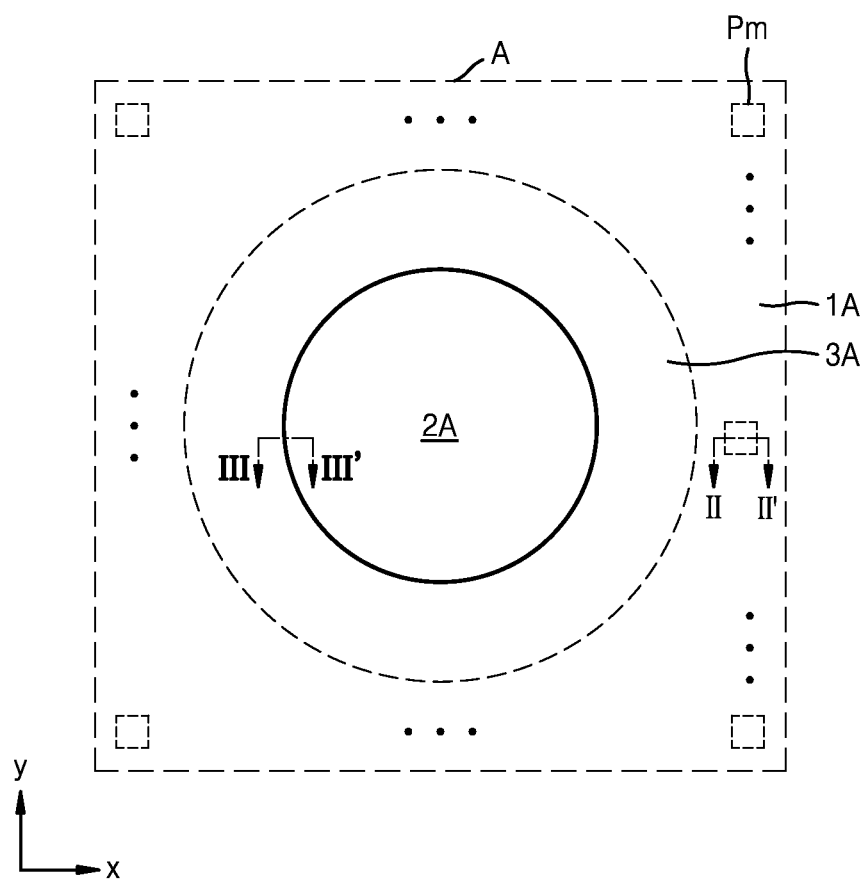
FIG. 6 is an enlarged view of portion A of FIG. 5 according to an embodiment.

FIG. 5 is a schematic plan view of the display apparatus 1 according to an embodiment. FIG. 6 is an enlarged view of portion A of FIG. 5 according to an embodiment.

Referring to FIG. 5, the display apparatus 1 may include a first area 1A, a second area 2A, a third area 3A, and a fourth area 4A. FIG. 5 illustrates a substrate 100 of the display apparatus 1. For example, the substrate 100 includes the first area 1A, the second area 2A, the third area 3A, and the fourth area 4A.

The display apparatus 1 may include main pixels Pm disposed in the first area 1A. Each of the main pixels Pm may include a display element and an organic light-emitting diode as a display element connected to the pixel circuit. Each of the main pixels Pm may be connected to and receive signals from a data line DL and a signal line SL. Each of the main pixels Pm may emit red light, green light, or blue light from the organic light-emitting diode, or may emit red light, green light, blue light, or white light through the organic light-emitting diode.

The third area 3A may surround the second area 2A in a plan view. The third area 3A is an area in which no display element such as the organic light-emitting diode emitting light is arranged. In the third area 3A, signal lines configured to provide signals to the main pixels Pm around the second area 2A may be arranged. In the fourth area 4A, a scan driver 1100 configured to provide a scan signal to each main pixel Pm, a data driver 1200 configured to provide a data signal to each main pixel Pm, and main power lines configured to provide power supply voltages, may be arranged.

Although FIG. 5 illustrates that the data driver 1200 is disposed adjacent to one side of the substrate 100, the data driver 1200 may be disposed on a flexible printed circuit board (FPCB) electrically connected to a pad on one side of the display apparatus 1 according to embodiments.

Figure 7:
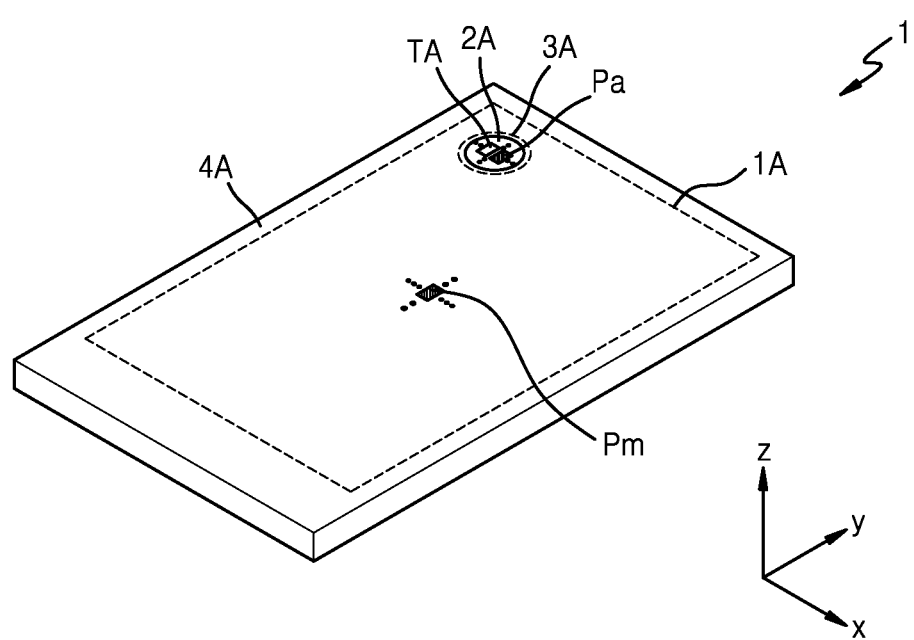
FIG. 7 is a schematic perspective view of a display apparatus according to an embodiment.

FIG. 7 is a schematic perspective view of a display apparatus 1 according to an embodiment. The embodiment of FIG. 7 differs from the embodiment of FIG. 1 in that an auxiliary pixel Pa is disposed in a second area 2A.

Referring to FIG. 7, the display apparatus 1 may include a first area 1A and the second area 2A disposed within the first area 1A. The first area 1A may partially surround the second area 2A. Main pixels Pm may be disposed in the first area 1A. The auxiliary pixels Pa may be disposed in the second area 2A. The display apparatus 1 may provide a certain image by using light emitted from the main pixels Pm in the first area 1A and light emitted from the auxiliary pixels Pa in the second area 2A. The second area 2A may include a transmission area TA.

In the second area 2A, a component 20 (see FIG. 2A), which is an electronic element, may be disposed under a display panel corresponding to the second area 2A. The component 20 may include an imaging element such as a camera using infrared light or visible light. Alternatively, the component 20 may include, for example, a solar cell, a flash, an illuminance sensor, a proximity sensor, and an iris sensor. Alternatively, the component 20 may have a sound receiving function. In order to reduce the function limitation of the component 20, the second area 2A may include a transmission area TA through which light and/or sound output from the component 20 to outside of the display apparatus 1 or light and/or sound directed from outside of the display apparatus 1 to the component 20 is transmitted. According to an embodiment, when light is transmitted through the second area 2A, the light transmittance of the second area 2A may be about 10% or more when the transmission area TA is utilized compared to when the transmission area TA is not utilized. According to an embodiment, when light is transmitted through the second area 2A, the light transmittance of the second area 2A may be about 40% or more, 25% or more, 50% or more, 85% or more, or 90% or more when the transmission area TA is utilized compared to when the transmission area TA is not utilized.

Figure 8:
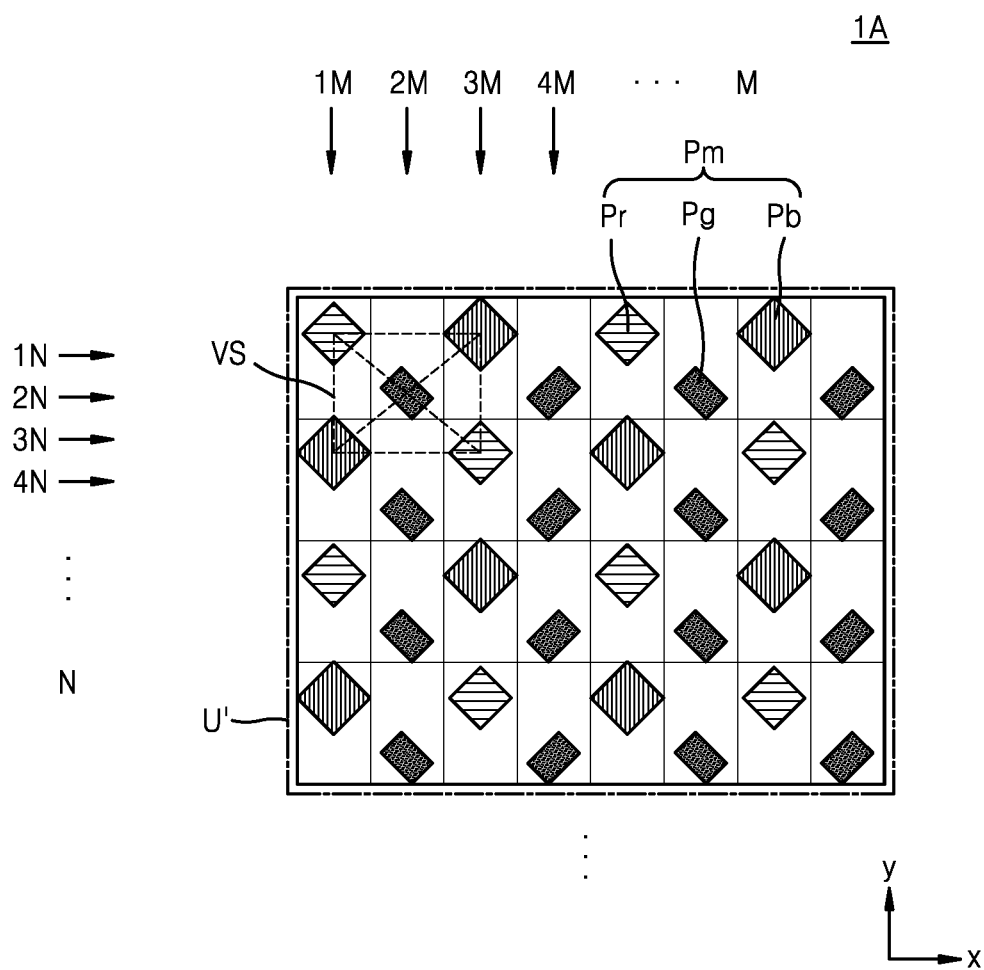
FIG. 8 is a layout diagram schematically illustrating an arrangement structure of main pixels in a first area, according to an embodiment.

FIG. 8 is a layout diagram schematically illustrating an arrangement structure of main pixels Pm in a first area 1A, according to an embodiment.

Main pixels Pm may be disposed in the first area 1A. Herein, the term "pixel" refers to an emission area that is the minimum unit for displaying an image. When an organic light-emitting diode is used as a display element, the emission area may be defined by an opening of a pixel defining layer, which will be described later.

As illustrated in FIG. 8, the main pixels Pm in the first area 1A may be arranged in a pentile structure. The main pixels Pm may include a first pixel Pr, a second pixel Pg, and a third pixel Pb. The first pixel Pr, the second pixel Pg, and the third pixel Pb may provide a red color, a green color, and a blue color, respectively.

First pixels Pr and third pixels Pb are alternately arranged in a first row 1N. Second pixels Pg are arranged in an adjacent second row 2N at certain intervals. The third pixels Pb and the first pixels Pr are alternately arranged in an adjacent third row 3N. The second pixels Pg are arranged in an adjacent fourth row 4N at certain intervals. Such a pixel arrangement is repeated up to an $N^{th}$ row. In this case, the first pixel Pr and the third pixel Pb may greater than the second pixel Pg.

The first pixels Pr and the third pixels Pb in the first row 1N and the second pixels Pg in the second row 2N may be alternately arranged. For example, in an embodiment, the first pixels Pr and the third pixels Pb are alternately arranged in a first column 1M, and the second pixels Pg are arranged in an adjacent second column 2M at certain intervals. Further, the third pixels Pb and the first pixels Pr are alternately arranged in an adjacent third column 3M. Further, the second pixels Pg are arranged in an adjacent fourth column 4M at certain intervals. Such a pixel arrangement is repeated up to an $M^{th}$ column.

Such a pixel arrangement structure may be expressed differently as follows. In an embodiment, the first pixels Pr are arranged at first and third vertices facing each other among the vertices of a virtual quadrangle VS having the central point of the second pixel Pg as the central point of the quadrangle, and the third pixels Pb are arranged at the remaining second and fourth vertices. In this case, the virtual quadrangle VS may be variously modified into, for example, a rectangle, a rhombus, a square, and the like.

Such a pixel arrangement structure is referred to as a pentile matrix structure or a pentile structure. By applying a rendering drive that expresses colors by sharing adjacent pixels, high resolution may be implemented with a small number of pixels.

Although FIG. 8 illustrates that the main pixels Pm are arranged in a pentile matrix structure, embodiments of the disclosure are not limited thereto. For example, in an embodiment, the main pixels Pm may be arranged in various shapes, for example, a stripe structure, a mosaic arrangement structure, a delta arrangement structure, and the like.

Figure 9:
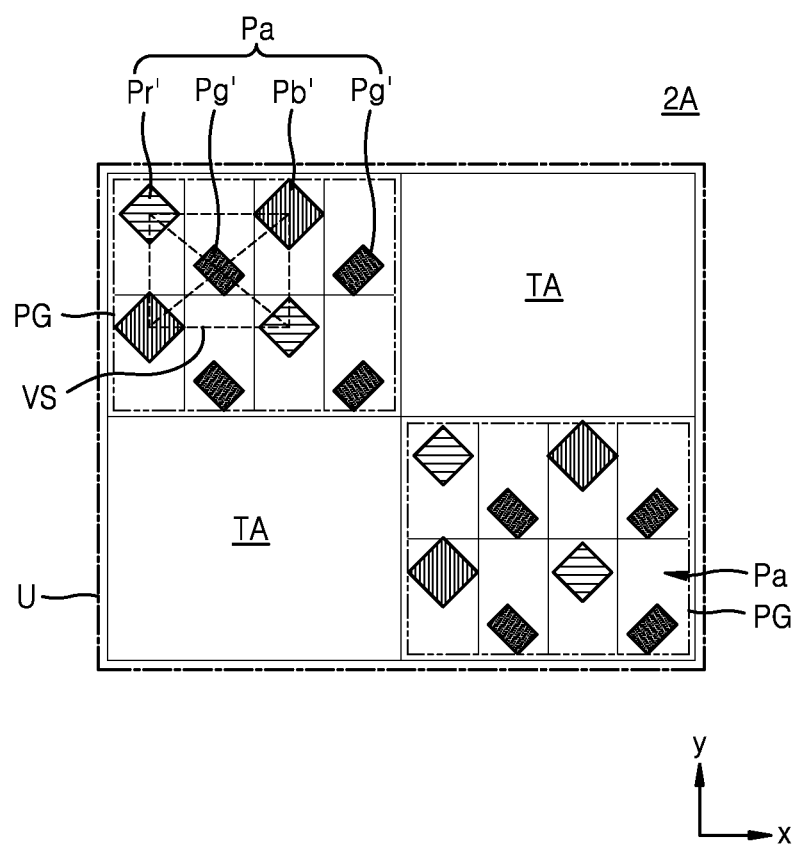
FIGS. 9 and 10 are layout diagrams schematically illustrating an arrangement structure of auxiliary pixels in a second area, according to an embodiment.
Figure 10:
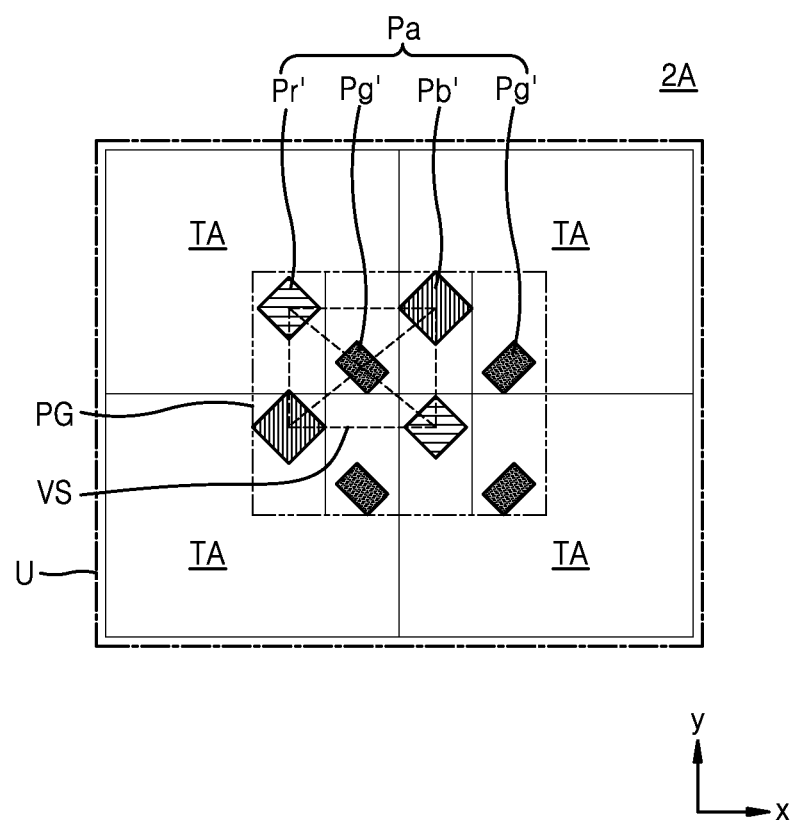

FIGS. 9 and 10 are layout diagrams schematically illustrating an arrangement structure of auxiliary pixels Pa in a second area 2A, according to an embodiment.

Referring to FIG. 9, the auxiliary pixels Pa may be disposed in the second area 2A. The auxiliary pixels Pa in the second area 2A may be arranged in a pentile structure. The auxiliary pixels Pa may include a first pixel Pr', a second pixel Pg', and a third pixel Pb'. The first pixel Pr', the second pixel Pg', and the third pixel Pb' may provide a red color, a green color, and a blue color, respectively.

The second area 2A may have transmission areas TA and pixel groups PG including at least one auxiliary pixel Pa.

The pixel groups PG and the transmission areas TA may be alternately arranged in the x direction and the y direction. For example, the pixel groups PG and the transmission areas TA may be arranged in a grid shape. In this case, the second area 2A may include a plurality of pixel groups PG and a plurality of transmission areas TA.

The pixel group PG may be defined as a pixel aggregate in which a plurality of auxiliary pixels Pa is grouped in a preset unit. For example, as illustrated in FIG. 9, one pixel group PG may include eight auxiliary pixels Pa arranged in a pentile structure. That is, one pixel group PG may include two first pixels Pr', four second pixels Pg', and two third pixels Pb'.

In the second area 2A, basic units U in which a certain number of pixel groups PG and a certain number of transmission areas TA are grouped may be repeatedly arranged in the x direction and the y direction. In FIG. 9, the basic unit U may have a shape in which two pixel groups PG and two transmission areas TA around the two pixel groups PG are grouped in a square shape. The basic unit U partitions a repetitive shape and does not mean a disconnection in configurations.

A corresponding unit U' provided with the same area as that of the basic unit U may be set in the first area 1A (see FIG. 8). In this case, the number of main pixels Pm included in the corresponding unit U' may be greater than the number of auxiliary pixels Pa included in the basic unit U. For example, in an embodiment, the number of auxiliary pixels Pa included in the base unit U is 16, and the number of main pixels Pm included in the corresponding unit U' is 32. That is, in an embodiment, a ratio of the number of auxiliary pixels Pa to the number of main pixels Pm with respect to the same area may be 1:2.

As illustrated in FIG. 9, the arrangement structure of the auxiliary pixels Pa is a pentile structure, and the pixel arrangement structure of the second area 2A, which has half the resolution of the first area 1A, is referred to as a ½ pentile structure. A design change may be made to the arrangement or number of auxiliary pixels Pa included in the pixel group PG according to the resolution of the second area 2A.

Referring to FIG. 10, the pixel arrangement structure of the second area 2A may be provided in a ¼ pentile structure. According to an embodiment, eight auxiliary pixels Pa are arranged in the pixel group PG in a pentile structure, but only one pixel group PG is included in the basic unit U. The remaining area of the basic unit U may be provided as the transmission area TA. Therefore, a ratio of the number of auxiliary pixels Pa to the number of main pixels Pm with respect to the same area may be provided in a ratio of 1:4. In this case, one pixel group PG may be surrounded by the transmission area TA.

Although FIGS. 9 and 10 illustrate a case in which the auxiliary pixels Pa are arranged in a pentile matrix structure, embodiments of the disclosure are not limited thereto. For example, in an embodiment, the auxiliary pixels Pa may be arranged in various shapes, for example, a stripe structure, a mosaic arrangement structure, a delta arrangement structure, and the like.

Also, although FIGS. 9 and 10 illustrate a case in which the size of the auxiliary pixel Pa is the same as the size of the main pixel Pm of FIG. 8, embodiments of the disclosure are not limited thereto. For example, in an embodiment, the size of the auxiliary pixel Pa may be greater than the size of the main pixel Pm emitting the same color. For example, the size of the third pixel Pb' of the auxiliary pixel Pa may be greater than the size of the third pixel Pb of the main pixel Pm. The difference in size may be designed considering the difference in luminance and/or resolution between the second area 2A and the first area 1A.

Figure 11:
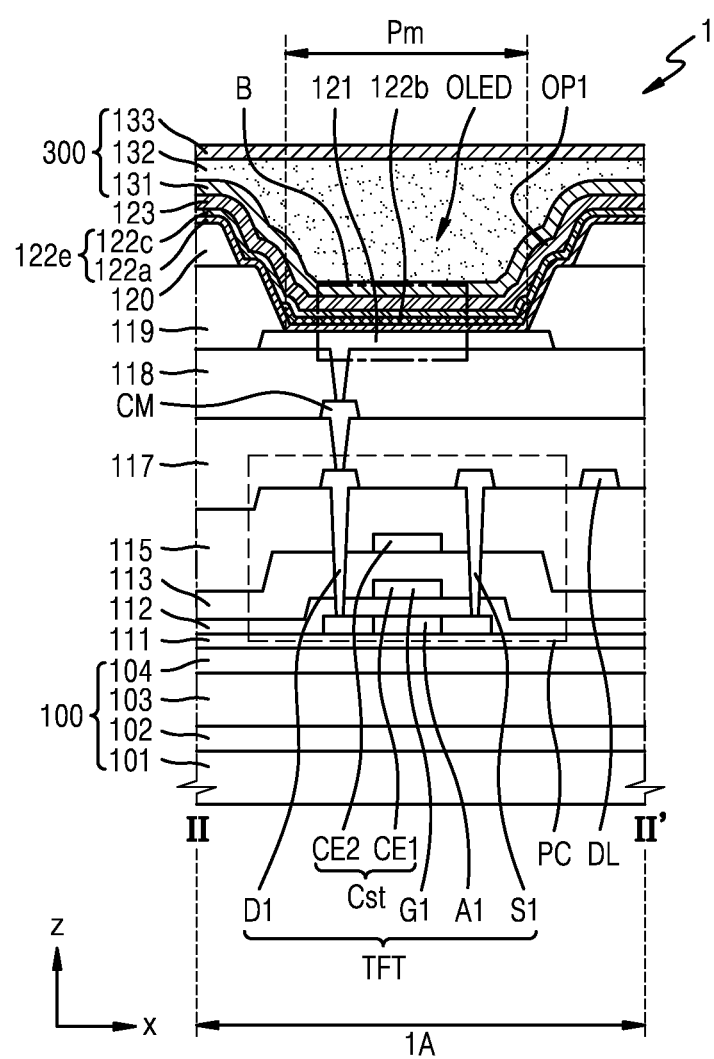
FIG. 11 is a schematic cross-sectional view of a portion of a display apparatus, according to an embodiment taken along line II-IF of FIG. 6.

FIG. 11 is a cross-sectional view of a portion of the display apparatus 1, according to an embodiment. For example, FIG. 11 is a cross-sectional view of a portion of the display apparatus 1 taken along line II-II' of FIG. 6.

Hereinafter, a structure in which elements included in the display apparatus 1 are stacked will be described.

Referring to FIG. 11, the substrate 100 may include an insulating material such as a polymer resin. The substrate 100 may include a flexible substrate that is bendable, foldable, or rollable.

According to an embodiment, the substrate 100 may include a first base layer 101, a first barrier layer 102, a second base layer 103, and a second barrier layer 104, which are sequentially stacked.

Each of the first base layer 101 and the second base layer 103 may include a polymer resin having high heat resistance. For example, each of the first base layer 101 and the second base layer 103 may include at least one of polyethersulfone, polyacrylate, polyether imide, polyethylene naphthalate, polyethylene terephthalate, polyphenylene sulfide, polyarylate, polyimide, polycarbonate, cellulose triacetate, cellulose acetate propionate, or polyarylene ether sulfone. In an embodiment, each of the first base layer 101 and the second base layer 103 may include polyimide.

The first barrier layer 102 may be disposed between the first base layer 101 and the second base layer 103, and the second barrier layer 104 may be disposed on the second base layer 103. The first barrier layer 102 and the second barrier layer 104 may prevent or reduce infiltration of ambient air. Each of the first barrier layer 102 and the second barrier layer 104 may include an inorganic insulating material such as, for example, silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). According to an embodiment, each of the first barrier layer 102 and the second barrier layer 104 may include silicon oxide ($SiO_x$).

The buffer layer 111 may be disposed on the substrate 100, may reduce or prevent infiltration of foreign material, moisture, or ambient air from below the substrate 100, and may provide a substantially flat surface on the substrate 100. The buffer layer 111 may include, for example, an inorganic material such as oxide or nitride, an organic material, or an organic-inorganic composite material, and may have a single-layer or multilayer structure including an inorganic material and an organic material. According to an embodiment, the buffer layer 111 may include silicon oxide ($SiO_x$) or silicon nitride ($SiN_x$). According to an embodiment, the buffer layer 111 may include a first buffer layer and a second buffer layer, the first buffer layer may include silicon oxide ($SiO_x$), and the second buffer layer may include silicon nitride ($SiN_x$). According to an embodiment, the first buffer layer may include silicon nitride ($SiN_x$), and the second buffer layer may include silicon oxide ($SiO_x$). According to an embodiment, the first buffer layer and the second buffer layer may include the same material. For example, both the first buffer layer and the second buffer layer may include silicon oxide ($SiO_x$), and both of the first buffer layer and the second buffer layer may include silicon nitride ($SiN_x$).

A main thin-film transistor TFT may be disposed on the buffer layer 111. The main thin-film transistor TFT may include a first semiconductor layer A1, a first gate electrode G1, a first source electrode S1, and a first drain electrode D1. The main thin-film transistor TFT may be connected to a main organic light-emitting diode OLED and drive the main organic light-emitting diode OLED.

According to an embodiment, the first semiconductor layer A1 may be disposed on the buffer layer 111 and may include polysilicon. According to an embodiment, the first semiconductor layer A1 may include amorphous silicon. According to an embodiment, the first semiconductor layer A1 may include an oxide including at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The first semiconductor layer A1 may include a channel region, and a drain region and a source region doped with impurities.

A first insulating layer 112 may cover the first semiconductor layer A1. The first insulating layer 112 may include an inorganic insulating material such as, for example, silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The first insulating layer 112 may include a single layer or multiple layers including the above-described inorganic insulating material.

The first gate electrode G1 may be arranged on the first insulating layer 112 to overlap the first semiconductor layer A1. The first gate electrode G1 may include, for example, molybdenum (Mo), aluminum (Al), copper (Cu), titanium (Ti), and the like, and may include a single layer or multiple layers. According to an embodiment, the first gate electrode G1 may include a single molybdenum (Mo) layer.

A second insulating layer 113 may cover the first gate electrode G1. The second insulating layer 113 may include an inorganic insulating material such as, for example, silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The second insulating layer 113 may include a single layer or multiple layers including the above-described inorganic insulating material.

A first upper electrode CE2 of a main storage capacitor Cst may be disposed on the second insulating layer 113. The first upper electrode CE2 may overlap the first gate electrode G1 disposed therebelow. According to an embodiment, the first gate electrode G1 may be a first lower electrode CE1 of the main storage capacitor Cst. The first gate electrode G1 and the first upper electrode CE2 overlapping each other with the second insulating layer 113 disposed therebetween may constitute the main storage capacitor Cst. According to an embodiment, the first lower electrode CE1 of the main storage capacitor Cst may be provided as a separate element that is apart from the first gate electrode G1 of the main thin-film transistor TFT.

The first upper electrode CE2 may include, for example, aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), and/or copper (Cu), and may include a single layer or multiple layers including the above-described material.

A third insulating layer 115 may cover the first upper electrode CE2. The third insulating layer 115 may include an inorganic insulating material such as, for example, silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO).

A data line DL, the first source electrode S1, and the first drain electrode D1 may be disposed on the third insulating layer 115. Each of the data line DL, the first source electrode S1, and the first drain electrode D1 may include a conductive material including, for example, molybdenum (Mo), aluminum (Al), copper (Cu), titanium (Ti), and the like, and may include a single layer or multiple layers including the above-described material. According to an embodiment, the data line DL, the first source electrode S1, and the first drain electrode D1 may have a multilayer structure of titanium (Ti)/aluminum (Al)/titanium (Ti).

A first planarization layer 117 may cover the data line DL, the first source electrode S1, and the first drain electrode D1, and a second planarization layer 118 may be disposed on the first planarization layer 117. The second planarization layer 118 may have a substantially flat upper surface so that a first pixel electrode 121 thereon may be formed to be substantially flat.

Each of the first planarization layer 117 and the second planarization layer 118 may include an organic material or an inorganic material, and may have a single-layer structure or a multilayer structure. Each of the first planarization layer 117 and the second planarization layer 118 may include, for example, a general-purpose polymer (e.g., benzocyclobutene (BCB), polyimide, hexamethyldisiloxane (HMDSO), polymethylmethacrylate (PMMA), polystyrene (PS), etc.), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer. Each of the first planarization layer 117 and the second planarization layer 118 may include an inorganic insulating material such as, for example, silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). When the first planarization layer 117 and the second planarization layer 118 are formed, chemical and mechanical polishing may be performed on the upper surface thereof so as to provide substantially flat upper surfaces after the formation of the first planarization layer 117 and the second planarization layer 118.

According to an embodiment, the first planarization layer 117 and the second planarization layer 118 may include the same material. According to an embodiment, the first planarization layer 117 and the second planarization layer 118 may include different materials from each other. According to an embodiment, the second planarization layer 118 may be omitted.

A connection electrode CM may be disposed between the first planarization layer 117 and the second planarization layer 118. The first pixel electrode 121 disposed on the second planarization layer 118 may be electrically connected to the main thin-film transistor TFT through the connection electrode CM.

The main organic light-emitting diode OLED may be disposed on the second planarization layer 118. The main organic light-emitting diode OLED may include the pixel electrode 121, a first emission layer 122b, and an opposite electrode 123. The first pixel electrode 121 may disposed be on the second planarization layer 118. According to an embodiment, the first pixel electrode 121 may include a conductive oxide such as, for example, indium tin oxide (ITO), indium zinc oxide (IZO), zinc oxide (ZnO), indium oxide ($In_2O_3$), indium gallium oxide (IGO), or aluminum zinc oxide (AZO).

According to an embodiment, the first pixel electrode 121 may include a reflective layer including, for example, silver (Ag), magnesium (Mg), aluminum (Al), platinum (Pt), palladium (Pd), gold (Au), nickel (Ni), neodymium (Nd), Iridium (Jr), chromium (Cr), or any compound thereof. For example, the first pixel electrode 121 may have a structure including layers including ITO, IZO, ZnO, or $In_2O_3$ above and/or below the reflective layer. In this case, the first pixel electrode 121 may have a structure in which ITO/Ag/ITO are sequentially stacked.

A pixel defining layer 119 may be disposed on the first pixel electrode 121. The pixel defining layer 119 may be disposed on the first pixel electrode 121 and may include a first opening OP1 that exposes at least a portion of the first pixel electrode 121. The emission area of the organic light-emitting diode OLED, that is, the size and shape of the main pixel Pm, may be defined by the first opening OP1 defined by the pixel defining layer 119.

The pixel defining layer 119 may prevent or reduce an electric arc or the like from occurring on the edge of the first pixel electrode 121 by increasing the distance between the edge of the first pixel electrode 121 and the opposite electrode 123 on the first pixel electrode 121. The pixel defining layer 119 may be formed through spin coating or the like by using an organic insulating material such as, for example, polyimide, polyamide, acrylic resin, benzocyclobutene, hexamethyldisiloxane (HMDSO), and phenol resin. According to an embodiment, a spacer 120 may be further provided on the pixel defining layer 119.

The first emission layer 122b corresponding to the first pixel electrode 121 may be disposed in the first opening OP1 of the pixel defining layer 119. The first emission layer 122b may include a high molecular weight organic material or a low molecular weight organic material, and may emit red light, green light, blue light, or white light.

An organic functional layer 122e may be disposed above and/or below the first emission layer 122b. The organic functional layer 122e may include a first functional layer 122a and/or a second functional layer 122c. According to an embodiment, the first functional layer 122a and/or the second functional layer 122c may be omitted.

The first functional layer 122a may be disposed below the first emission layer 122b. The first functional layer 122a may include a single layer or multiple layers including an organic material. The first functional layer 122a may include a hole transport layer (HTL) having a single-layer structure. Alternatively, the first functional layer 122a may include a hole injection layer (HIL) and a hole transport layer (HTL). The first functional layer 122a may be integrally provided to correspond to the main organic light-emitting diodes OLED in the first area 1A.

The second functional layer 122c may be disposed above the first emission layer 122b. The second functional layer 122c may include a single layer or multiple layers including an organic material. The second functional layer 122c may include an electron transport layer (ETL) and/or an electron injection layer (EIL). The second functional layer 122c may be integrally provided to correspond to the main organic light-emitting diodes OLED in the first area 1A.

According to an embodiment, the EIL may include ytterbium (Yb). As a result, the electron injection barrier of the organic light-emitting diode may be lowered and the luminescence efficiency thereof may be increased.

The opposite electrode 123 may be disposed on the second functional layer 122c. The opposite electrode 123 may be disposed on the first pixel electrode 121. The opposite electrode 123 may be integrally provided to cover the first pixel electrode 121.

The opposite electrode 123 may include a conductive material having a low work function. For example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca), or any alloy thereof.

According to an embodiment, an upper layer may be disposed on the opposite electrode 123. The upper layer may protect the opposite electrode 123 and increase light extraction efficiency. The upper layer may include an organic material having a refractive index higher than that of the opposite electrode 123. Alternatively, the upper layer may be provided by stacking layers having different refractive indices from each other. For example, the upper layer may be provided by stacking a high refractive index layer/a low refractive index layer/a high refractive index layer. In this case, the refractive index of the high refractive index layer may be about 1.7 or more, and the refractive index of the low refractive index layer may be about 1.3 or less. The upper layer may include an inorganic insulating material such as, for example, silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO).

A thin-film encapsulation layer 300 may be disposed on the main organic light-emitting diode OLED of the display apparatus 1 and may function as a sealing member. That is, the main organic light-emitting diode OLED may be sealed by the thin-film encapsulation layer 300. The thin-film encapsulation layer 300 may be disposed on the opposite electrode 123. The thin-film encapsulation layer 300 may prevent or reduce infiltration of foreign matter or external moisture into the main organic light-emitting diode OLED.

The thin-film encapsulation layer 300 may include at least one inorganic layer and at least one organic layer. In this regard, FIG. 11 illustrates that the thin-film encapsulation layer 300 has a structure in which a first inorganic layer 131, an organic layer 132, and a second inorganic layer 133 are sequentially stacked. According to an embodiment, the number of inorganic layers, the number of organic layers, and the stacking order may be changed.

Each of the first inorganic layer 131 and the second inorganic layer 133 may include at least one inorganic insulating material such as, for example, silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO), and may be formed by chemical vapor deposition (CVD) or the like. The organic layer 132 may include a polymer-based material. The polymer-based material may include, for example, a silicone-based resin, an acrylic resin, an epoxy resin, polyimide, and polyethylene.

Figure 12:
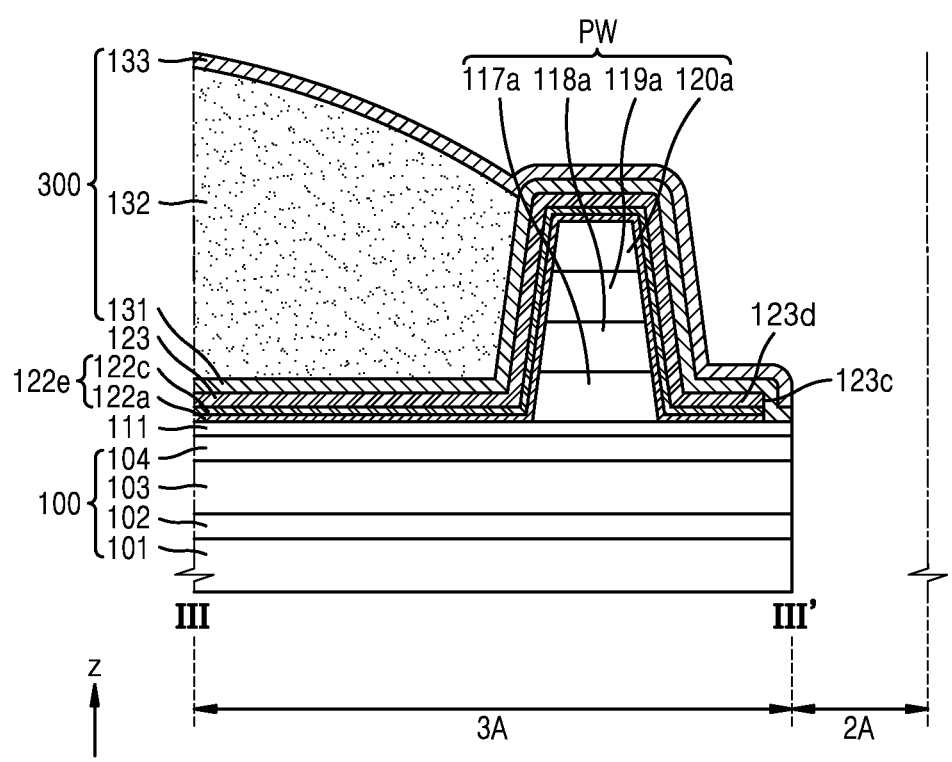
FIG. 12 is a schematic cross-sectional view of a portion of a display apparatus, according to an embodiment taken along line III-III of FIG. 6.

FIG. 12 is a schematic cross-sectional view of a portion of the display apparatus 1, according to an embodiment. For example, FIG. 12 is a cross-sectional view of a portion of the display apparatus 1 taken along line III-III of FIG. 6.

Referring to FIGS. 11 and 12, at least a portion of an organic functional layer 122e and an opposite electrode 123 disposed in a first area 1A may extend toward a third area 3A. That is, the organic functional layer 122e and the opposite electrode 123 may be disposed in the third area 3A. For example, in an embodiment, the opposite electrode 123 extends from the first area 1A to the third area 3A.

According to an embodiment, a dam PW may be disposed in the third area 3A. Although FIG. 12 illustrates that one dam PW is disposed in the third area MA, embodiments of the disclosure are not limited thereto. For example, according to embodiments, two or more dams PW may be disposed in the third area 3A.

The dam PW may be disposed on a substrate 100. The dam PW may include a plurality of organic insulating layers that are sequentially stacked. For example, the dam PW may have a structure in which a first organic insulating layer 117a, a second organic insulating layer 118a, a third organic insulating layer 119a, and a fourth organic insulating layer 120a are stacked. According to an embodiment, at least one of the first organic insulating layer 117a, the second organic insulating layer 118a, the third organic insulating layer 119a, or the fourth organic insulating layer 120a may be omitted.

According to an embodiment, the first organic insulating layer 117a may include the same material as that of the first planarization layer 117 of FIG. 11, the second organic insulating layer 118a may include the same material as that of the second planarization layer 118 of FIG. 11, the third organic insulating layer 119a may include the same material as that of the pixel defining layer 119 of FIG. 11, and the fourth organic insulating layer 120a may include the same material as that of the spacer 120 of FIG. 11.

The opposite electrode 123 and the organic functional layer 122e including the first functional layer 122a and the second functional layer 122c may be disposed on the dam PW.

The thin-film encapsulation layer 300 may be disposed on the dam PW. The thin-film encapsulation layer 300 may include the first inorganic layer 131, the organic layer 132, and the second inorganic layer 133, which are sequentially stacked. According to an embodiment, the first inorganic layer 131 and the second inorganic layer 133 of the thin-film encapsulation layer 300 may be in direct contact with each other on the dam PW.

According to an embodiment, the dam PW provided in the third area 3A may prevent or a monomer forming the organic layer 132 from being lost to a cutting line, or may reduce the amount of the monomer that is lost.

According to an embodiment, the first inorganic layer 131 and the second inorganic layer 133 of the thin-film encapsulation layer 300 may cover an end 123c of the opposite electrode 123.

After the organic functional layer 122e including the first functional layer 122a and the second functional layer 122c, and the opposite electrode 123, are completely deposited on the display panel, the organic functional layer 122e and the opposite electrode 123 deposited in the second area 2A may be removed through a laser lift-off process. For example, after the organic functional layer 122e and the opposite electrode 123 are completely deposited on a sacrificial layer of the second area 2A, the organic functional layer 122e and the opposite electrode 123 disposed on the second area 2A may be removed using a laser.

However, during the laser lift-off process, an irregular shape may be formed in an edge portion 123d of the opposite electrode 123 adjacent to the end 123c of the opposite electrode 123. For example, during the laser lift-off process, a burr may be formed in the edge portion 123d of the opposite electrode 123. The burr formed in the edge portion 123d of the opposite electrode 123 may extend in an oblique direction away from the upper surface of the substrate 100, and the cross-section thereof may have an irregular unevenness.

The thickness of the first inorganic layer 131 disposed on the opposite electrode 123 may not be constant due to the burr formed in the edge portion 123d of the opposite electrode 123. For example, the first inorganic layer 131 may have a convex upper surface in a direction substantially perpendicular to the substrate 100 along the shape of the burr formed in the edge portion 123d of the opposite electrode 123.

Although the first inorganic layer 131 has relatively excellent step coverage, the edge portion 123d of the opposite electrode 123 disposed under the first inorganic layer 131 may have an irregular shape. Thus, the first inorganic layer 131 may include a portion having a locally small density and/or a portion having a locally small thickness. In this case, cracks may be generated in the first inorganic layer 131. The cracks may propagate into the organic light-emitting diode OLED, causing damage to the organic light-emitting diode (OLED), or moisture or the like may penetrate into a portion of the first inorganic layer 131 having a locally small density and/or a locally small portion, causing the organic light-emitting diodes OLED to be oxidized.

Figure 13:
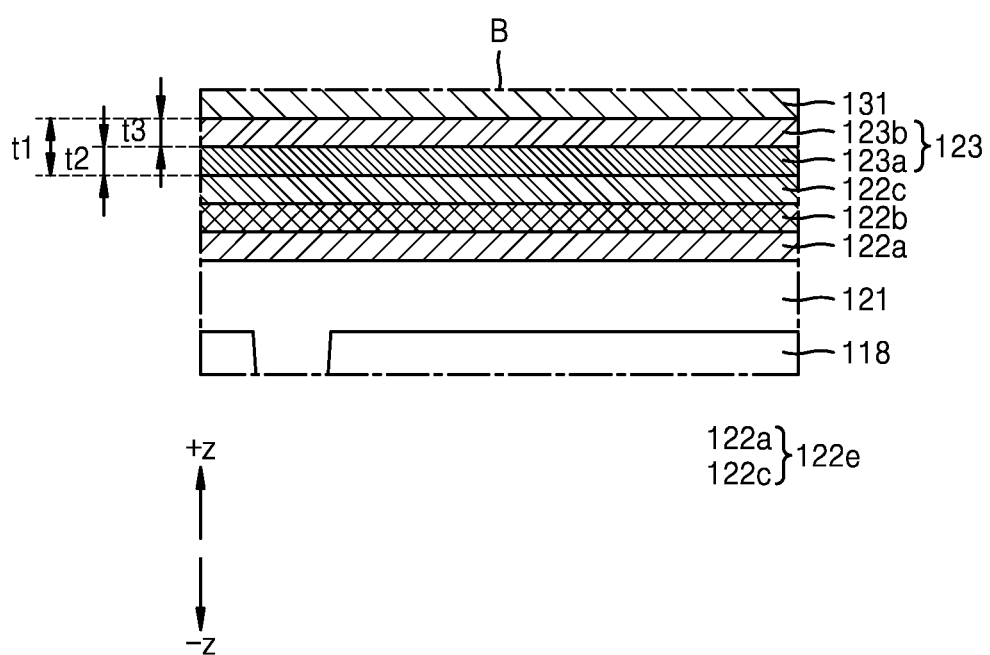
FIG. 13 is an enlarged view of portion B of FIG. 11 according to an embodiment.

FIG. 13 is an enlarged view of portion B of FIG. 11 according to an embodiment.

Referring to FIG. 13, the opposite electrode 123 may include a first layer 123a and a second layer 123b. According to an embodiment, the first layer 123a may be closer to the substrate 100 than the second layer 123b is to the substrate 100.

According to an embodiment, the opposite electrode 123 may have a thickness t1 of about 50 Å to about 150 Å. A thickness t2 of the first layer 123a of the opposite electrode 123 may be about 1/10 to about 4/5 of the thickness t1 of the opposite electrode 123. A thickness t3 of the second layer 123b of the opposite electrode 123 may be about 1/5 to about 9/10 of the thickness t1 of the opposite electrode 123.

According to an embodiment, the first layer 123a of the opposite electrode 123 may include a first material. According to an embodiment, the first material may be one of, for example, silver (Ag), copper (Cu), aluminum (Al), and chromium (Cr). According to an embodiment, the first layer 123a may include a single material. For example, the first layer 123a may include silver (Ag). That is, according to an embodiment, the first layer 123a may include only a single material, and not any other materials, and this single material may be one of, for example, silver (Ag), copper (Cu), aluminum (Al), and chromium (Cr). The second layer 123b of the opposite electrode 123 may include an alloy. The alloy may include a first material and a second material. According to an embodiment, the first material may include one of silver (Ag), copper (Cu), aluminum (Al), and chromium (Cr), and the second material may include one of magnesium (Mg), platinum (Pt), palladium (Pd), gold (Au), nickel (Ni), neodymium (Nd), iridium (Jr), lithium (Li), and calcium (Ca). For example, the second material may include magnesium (Mg). Therefore, the second layer 123b may include a silver-magnesium (AgMg) alloy.

According to an embodiment, the first material may have a ductility greater than that of the second material, and the second material may have a brittleness greater than that of the first material.

According to an embodiment, the first pixel electrode 121 may be disposed in the first area 1A of a display panel, and the opposite electrode 123 may be disposed on the first pixel electrode 121. The opposite electrode 123 may include the first layer 123a including only a first material (e.g., silver (Ag)), and the second layer 123b including an alloy that includes the first material (e.g., a silver-magnesium (AgMg) alloy). Since the first layer 123a of the opposite electrode 123 includes only a single material having high ductility, the bendability of the opposite electrode 123 may be increased.

As a result, the formation of a burr in the edge portion of the opposite electrode 123 which may be formed, for example, during a laser lift-off process, may be prevented or reduced.

According to an embodiment, when the first layer 123a of the opposite electrode 123 includes a single material, for example, the first material, and the second layer 123b of the opposite electrode 123 includes the alloy of the first material and the second material, the amount of the second material in the second layer 123b of the opposite electrode 123 may be about 5% to about 40%. That is, the amount of the second material in the second layer 123b may form about 5% to about 40% of the total amount of the second layer 123b. The amount of the second material in the second layer 123b of the opposite electrode 123 may be variously changed. For example, the amount of the second material in the second layer 123b of the opposite electrode 123 may be about 10% to about 40%, may be about 10% to about 35%, and may be about 20% to about 35% according to embodiments.

For example, when the first layer 123a of the opposite electrode 123 includes a single material, for example, silver (Ag), and the second layer 123b of the opposite electrode 123 includes the silver-magnesium (AgMg) alloy, the amount of magnesium in the second layer 123b of the opposite electrode 123 may be about 5% to about 40%. Alternatively, the amount of magnesium in the second layer 123b of the opposite electrode 123 may be variously changed. For example, the amount of magnesium in the second layer 123b of the opposite electrode 123 may be about 10% to about 40%, may be about 10% to about 35%, and may be about 20% to about 35% according to embodiments.

In general, silver (Ag) is known as a metal having high ductility, and magnesium (Mg) is known as a metal having low ductility. Because the first layer 123a of the opposite electrode 123 includes a single material, for example, silver (Ag) having high ductility, the bendability of the opposite electrode 123 may be increased. Thus, the formation of a burr in the edge portion 123d of the opposite electrode 123 during a laser lift-off process may be prevented or reduced according to embodiments.

Since the second layer 123b including the silver-magnesium (AgMg) alloy having the amount of magnesium in a range of about 5% to about 40% is disposed on the first layer 123a including the single material (e.g., silver (Ag)), the opposite electrode 123 may be formed with the same amount of material and the same thickness described above.

In addition, because the second layer 123b having a large amount of magnesium is disposed on the first layer 123a including the single material (e.g., silver (Ag)), oxidation of the first layer 123a due to infiltration of moisture or the like may be prevented or reduced.

Since the opposite electrode 123 includes the first layer 123a including the single material (e.g., silver (Ag)), the bendability of the display panel 10 and/or the display apparatus 1 may be increased. For example, because the first layer 123a including the single material (e.g., silver (Ag)) is closer to the substrate 100 than the second layer 123b including silver-magnesium (AgMg) is to the substrate 100, the bendability in the −z direction may be increased.

According to an embodiment, the opposite electrode 123 includes the first layer 123a including the single material (e.g., silver (Ag)) and the second layer 123b including the silver-magnesium (AgMg) alloy, and the amount of magnesium (Mg) in the second layer 123b may gradually increase from the bottom to the top of the second layer 123b. That is, the amount of magnesium (Mg) in the bottom of the second layer 123b may be the lowest relative to the rest of the second layer 123b, and the amount of magnesium (Mg) in the top of the second layer 123b may be the highest relative to the rest of the second layer 123b, with the amount of magnesium (Mg) gradually increasing from the bottom to the top of the second layer 123b.

According to an embodiment, the opposite electrode 123 includes the first layer 123a including the single material (e.g., silver (Ag)) and the second layer 123b including the silver-magnesium (AgMg) alloy, and the amount of magnesium (Mg) in the second layer 123b may gradually increase from the top to the bottom of the second layer 123b. That is, the amount of magnesium (Mg) in the top of the second layer 123b may be the lowest relative to the rest of the second layer 123b, and the amount of magnesium (Mg) in the bottom of the second layer 123b may be the highest relative to the rest of the second layer 123b, with the amount of magnesium (Mg) gradually increasing from the top to the bottom of the second layer 123b.

Figure 14:
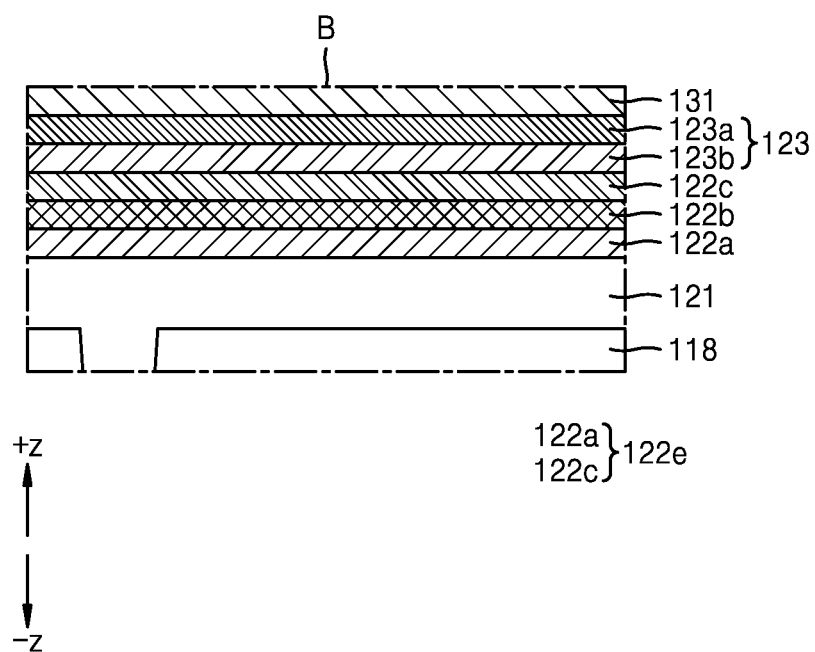
FIG. 14 is an enlarged view of portion B of FIG. 11 according to an embodiment.

FIG. 14 is an enlarged view of portion B of FIG. 11 according to an embodiment. The embodiment of FIG. 14 differs from the embodiment of FIG. 13 in that a second layer 123b is closer to a substrate 100 than a first layer 123a is to the substrate 100. In FIG. 14, the same reference numerals as those in FIG. 13 denote the same members, and for convenience of explanation, redundant descriptions thereof will be omitted.

Referring to FIG. 14, an opposite electrode 123 may include the first layer 123a and the second layer 123b. According to an embodiment, the second layer 123b may be closer to the substrate 100 than the first layer 123a is to the substrate 100.

According to an embodiment, the first layer 123a of the opposite electrode 123 may include a first material. According to an embodiment, the first material may include one of, for example, silver (Ag), copper (Cu), aluminum (Al), and chromium (Cr). According to an embodiment, the first layer 123a may include a single material. For example, the first layer 123a may include silver (Ag). The second layer 123b of the opposite electrode 123 may include an alloy. The alloy may include a first material and a second material. According to an embodiment, the first material may include one of, for example, silver (Ag), copper (Cu), aluminum (Al), and chromium (Cr), and the second material may include one of, for example, magnesium (Mg), platinum (Pt), palladium (Pd), gold (Au), nickel (Ni), neodymium (Nd), iridium (Jr), lithium (Li), and calcium (Ca). For example, the second material may include magnesium (Mg). Therefore, the second layer 123b may include a silver-magnesium (AgMg) alloy.

According to an embodiment, the first material may have a ductility greater than that of the second material, and the second material may have a brittleness greater than that of the first material.

Because the opposite electrode 123 includes the first layer 123a and the second layer 123b, and the first layer 123a including the single material (e.g., the first material) is disposed on the second layer 123b including the alloy, the bendability of the opposite electrode 123 may be increased. Thus, the formation of a burr in the edge portion 123d of the opposite electrode 123 during a laser lift-off process may be prevented or reduced, and the bendability of the display panel 10 and/or the display apparatus 1 may be increased. For example, because the second layer 123b including the alloy of the first material and the second material is closer to the substrate 100 than the first layer 123a including the single material (e.g., the first material), the bendability in the +z direction may be increased.

Figure 15:
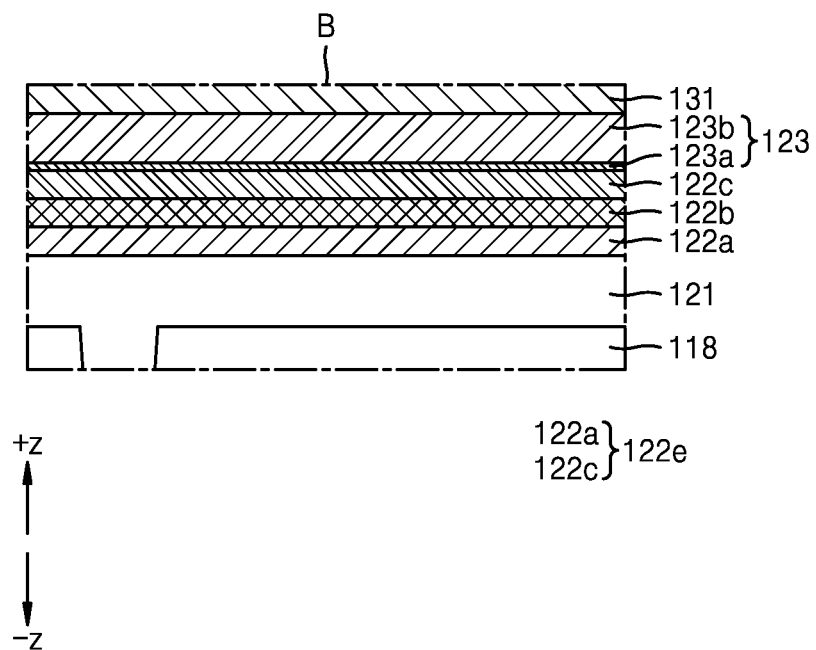
FIG. 15 is an enlarged view of portion B of FIG. 11 according to an embodiment.

FIG. 15 is an enlarged view of portion B of FIG. 11 according to an embodiment. The embodiment of FIG. 15 differs from the embodiment of FIG. 13 in that a first layer 123a including a single material (e.g., a first material) is provided with a small thickness. In FIG. 15, the same reference numerals as those in FIG. 13 denote the same members, and for convenience of explanation, redundant descriptions thereof will be omitted.

Referring to FIG. 15, an opposite electrode 123 may include the first layer 123a and a second layer 123b. According to an embodiment, the first layer 123a may be closer to the substrate 100 than the second layer 123b is to the substrate 100.

The opposite electrode 123 includes the first layer 123a including a single material (e.g., the first material) and the second layer 123b including an alloy of the first material and a second material. The amount of the second material in the second layer 123b may gradually increase from the bottom to the top of the second layer 123b. That is, the amount of the second material in the bottom of the second layer 123b may be the lowest relative to the rest of the second layer 123b, and the amount of the second material in the top of the second layer 123b may be the highest relative to the rest of the second layer 123b, with the amount of the second material gradually increasing from the bottom to the top of the second layer 123b. In this case, the first material may include silver (Ag), and the second material may include magnesium (Mg).

According to an embodiment, the first layer 123a of the opposite electrode 123 may be provided with a small thickness. For example, the thickness of the first layer 123a may be smaller than the thickness of the second layer 123b. According to an embodiment, the first layer 123a of the opposite electrode 123 may be omitted. The amount of the second material in the bottom of the second layer 123b may be 0%, and the amount of the first material in the bottom of the second layer 123b may be 100%. That is, in an embodiment, the second layer 123b includes the first material and the second material, but the bottom of the second layer 123b includes only the first material, and the amount of the first material may gradually decrease from the bottom to the top of the second layer 123b. In contrast, the amount of the second material may gradually increase from the bottom to the top of the second layer 123b.

The amount of the first material in the bottom of the second layer 123b of the opposite electrode 123 is greater than the amount of the first material in the top of the second layer 123b, and the amount of the second material in the bottom of the second layer 123b is less than the amount of the second material in the top of the second layer 123b. Thus, the bottom of the second layer 123b may have ductility higher than that of the top of the second layer 123b. Because the bottom of the second layer 123b has ductility higher than that of the top of the second layer 123b, the second layer 123b may have increased bendability in the −z direction. That is, the opposite electrode 123 may have increased bendability in the −z direction. Therefore, because the bendability of the opposite electrode 123 is increased in the −z direction, the formation of a burr in the edge portion 123d of the opposite electrode 123 during the laser lift-off process may be prevented or reduced, and the bendability of the display panel 10 and/or the display apparatus 1 may be increased.

Because the top of the second layer 123b of the opposite electrode 123 includes a larger amount of the second material than the bottom of the second layer 123b, infiltration of external moisture or foreign matter into the first layer 123a or the lower portion of the second layer 123b may be prevented or reduced.

Figure 16:
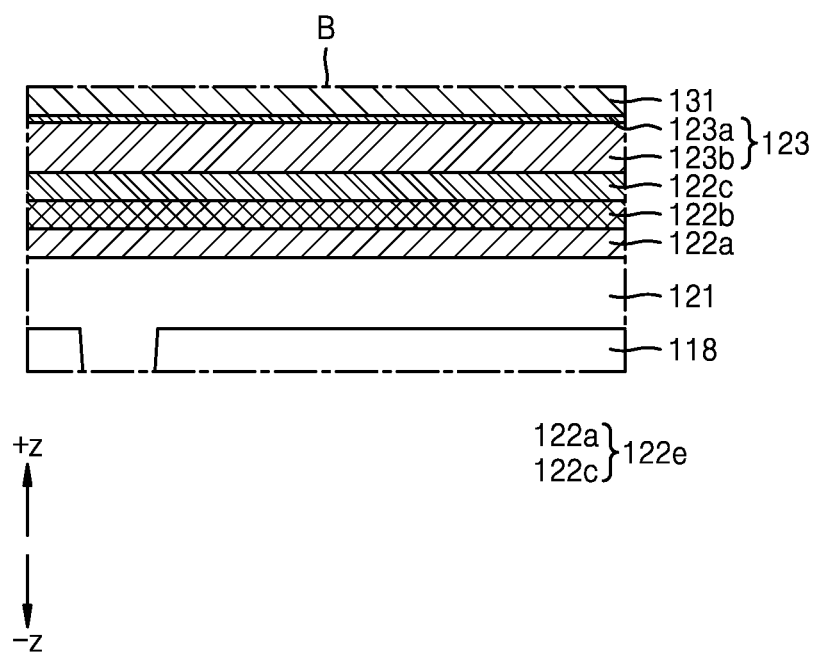
FIG. 16 is an enlarged view of portion B of FIG. 11 according to an embodiment.

FIG. 16 is an enlarged view of portion B of FIG. 11 according to an embodiment. The embodiment of FIG. 16 differs from the embodiment of FIG. 15 in that a second layer 123b is closer to a substrate 100 than a first layer 123a is to the substrate 100. In FIG. 16, the same reference numerals as those in FIG. 15 denote the same members, and for convenience of explanation, redundant descriptions thereof will be omitted.

Referring to FIG. 16, an opposite electrode 123 may include the first layer 123a and the second layer 123b. According to an embodiment, the second layer 123b may be closer to the substrate 100 than the first layer 123a is to the substrate 100.

The opposite electrode 123 includes the first layer 123a including a single material (e.g., a first material) and the second layer 123b including an alloy of the first material and a second material. The amount of the second material in the second layer 123b may gradually increase from the top to the bottom of the second layer 123b. That is, the amount of the second material in the top of the second layer 123b may be the lowest relative to the rest of the second layer 123b, and the amount of the second material in the bottom of the second layer 123b may be the highest relative to the rest of the second layer 123b, with the amount of magnesium (Mg) gradually increasing from the top to the bottom of the second layer 123b. In this case, the first material may include silver (Ag), and the second material may include magnesium (Mg).

According to an embodiment, the first layer 123a of the opposite electrode 123 may be provided with a small thickness. For example, the thickness of the first layer 123a may be less than the thickness of the second layer 123b. According to an embodiment, the first layer 123a of the opposite electrode 123 may be omitted. The amount of the second material in the top of the second layer 123b may be 0%, and the amount of the first material in the top of the second layer 123b may be 100%. That is, in an embodiment, the second layer 123b includes the first material and the second material, and the top of the second layer 123b includes only the first material and the bottom of the second layer 123b includes only the second material. The amount of the first material may gradually decrease from the top to the bottom of the second layer 123b. In contrast, the amount of the second material may gradually increase from the top to the bottom of the second layer 123b.

The amount of the first material in the top of the second layer 123b of the opposite electrode 123 is greater than the amount of the first material in the bottom of the second layer 123b, and the amount of the second material in the top of the second layer 123b is less than the amount of the second material in the bottom of the second layer 123b. Thus, the top of the second layer 123b may have ductility higher than that of the bottom of the second layer 123b. Because the top of the second layer 123b has ductility higher than that of the bottom of the second layer 123b, the second layer 123b may have increased bendability in the +z direction. That is, the opposite electrode 123 may have increased bendability in the +z direction. Therefore, because the bendability of the opposite electrode 123 is increased in the +z direction, the formation of a burr in the edge portion 123d of the opposite electrode 123 during the laser lift-off process may be prevented or reduced, and the bendability of the display panel 10 and/or the display apparatus 1 may be increased.

According to an embodiment, the display apparatus may have a bottom emission-type light-emitting structure instead of a top emission-type light-emitting structure. In this case, the opposite electrode included in the bottom emission-type light-emitting structure may be thicker than the opposite electrode included in the top emission-type light-emitting structure. The opposite electrode included in the bottom emission-type light-emitting structure may include two or more materials having different ductility and brittleness from each other. For example, the opposite electrode included in the bottom emission-type light-emitting structure may include the first layer including the first material and the second layer including the alloy of the first material and the second material. In this case, the ductility and brittleness of the first material may be different from the ductility and brittleness of the second material. For example, the first material may have a ductility greater than that of the second material, and the second material may have ductility less than the first material.

Because the first layer of the opposite electrode provided in the bottom emission-type light-emitting structure includes the single material, for example, silver (Ag) having high ductility, and the second layer includes the alloy, the bendability of the display apparatus 1 may be increased and the occurrence of dark spots may be prevented or reduced, thereby resulting in increased reliability of the display apparatus 1.

According to an embodiment, the opposite electrode included in the bottom emission-type light-emitting structure may have a structure as illustrated in FIGS. 15 and 16, and thus, may have increased bendability in a direction in which the amount of the first material increases.

Figure 17:
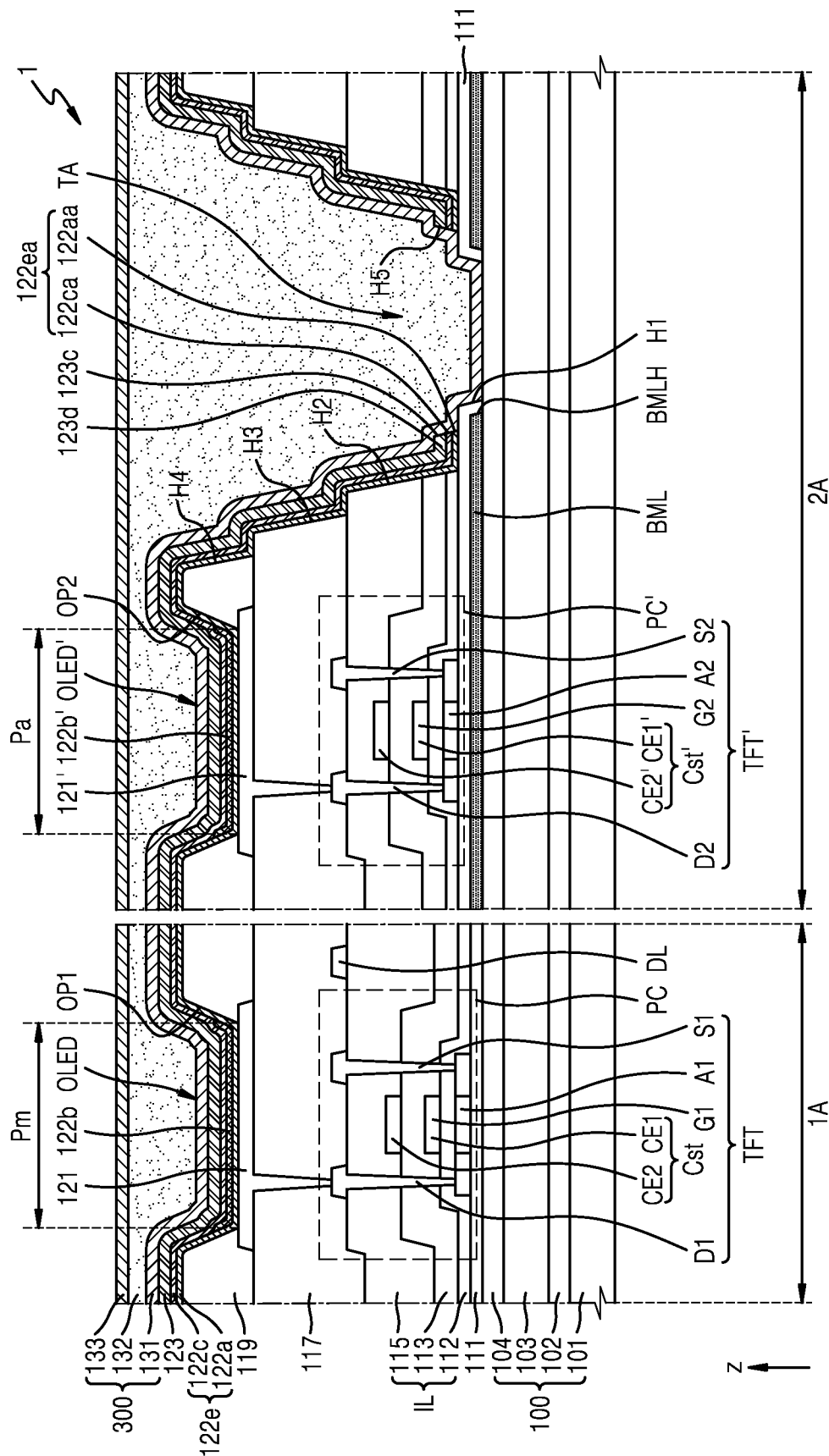
FIG. 17 is a schematic perspective view of a display apparatus according to an embodiment.

FIG. 17 is a schematic cross-sectional view of a display apparatus 1 according to an embodiment. In FIG. 17, the same reference numerals as those in FIG. 11 denote the same members, and for convenience of explanation, redundant descriptions thereof will be omitted.

Referring to FIG. 17, the display apparatus 1 may include a first area 1A and a second area 2A. A main pixel Pm may be disposed in the first area 1A, and an auxiliary pixel Pa may be disposed in the second area 2A. The second area 2A may include a transmission area TA. A main pixel circuit PC including a main thin-film transistor TFT and a main storage capacitor Cst, and a main organic light-emitting diode OLED as a display element connected to the main pixel circuit PC, may be disposed in the first area 1A. An auxiliary pixel circuit PC' including an auxiliary thin-film transistor TFT' and an auxiliary storage capacitor Cst', and an auxiliary organic light-emitting diode OLED' as a display element connected to the auxiliary pixel circuit PC', may be disposed in the second area 2A.

According to an embodiment, an organic light-emitting diode may be implemented as the display element. According to an embodiment, an inorganic light-emitting element or a quantum dot light-emitting element may be implemented as the display element.

Hereinafter, a structure in which elements included in the display apparatus 1 are stacked will be described.

According to an embodiment, a substrate 100 may include a first base layer 101, a first barrier layer 102, a second base layer 103, and a second barrier layer 104, which are sequentially stacked. The first barrier layer 102 may be disposed between the first base layer 101 and the second base layer 103, and the second barrier layer 104 may be disposed on the second base layer 103. The first barrier layer 102 and the second barrier layer 104 may prevent or reduce infiltration of external air.

A buffer layer 111 may be disposed on the substrate 100, may reduce or prevent infiltration of foreign material, moisture, or ambient air from below the substrate 100, and may provide a substantially flat surface on the substrate 100.

According to an embodiment, the buffer layer 111 may have a first hole H1 corresponding to the transmission area TA. The first hole H1 may expose at least a portion of the upper surface of the substrate 100. For example, the first hole H1 defined in the buffer layer 111 may expose at least a portion of the upper surface of the second barrier layer 104. Because the buffer layer 111 has the first hole H1 exposing at least a portion of the upper surface of the substrate 100, the light transmittance of the transmission area TA and/or the second area 2A may be increased.

According to an embodiment, at least a portion of the buffer layer 111 disposed in the second area 2A may extend toward the transmission area TA. That is, the buffer layer 111 may be disposed on the transmission area TA. The buffer layer 111 disposed on the transmission area TA may prevent or reduce infiltration of external moisture or foreign matter into the pixel circuits PC and PC' and/or the main and auxiliary organic light-emitting diodes OLED and OLED'.

In the second area 2A, a bottom metal layer BML may be disposed between the substrate 100 and the buffer layer 111. The bottom metal layer BML may be disposed below the auxiliary pixel circuit PC' and may prevent or reduce characteristics of the auxiliary thin-film transistor TFT' from deteriorating due to light emitted from the component 20 (see FIG. 2A). The bottom metal layer BML may prevent or reduce light emitted from or directed to the component 20 or the like from being diffracted through a narrow gap between lines connected to the auxiliary pixel circuit PC'. In an embodiment, the bottom metal layer BML is not disposed in the transmission area TA.

A bias voltage may be applied to the bottom metal layer BML. As the bottom metal layer BML is provided with a bias voltage, the probability of generating electrostatic discharge may be significantly reduced. The bottom metal layer BML may include, for example, aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), and/or copper (Cu). The bottom metal layer BML may include a single layer or multiple layers including the above-described material.

The bottom metal layer BML of the second area 2A may correspond to the entire second area 2A. The bottom metal layer BML may have a lower hole BMLH corresponding to the transmission area TA. According to an embodiment, the shape and size of the transmission area TA may be defined by the shape and size of the lower hole BMLH defined in the bottom metal layer BML.

The main thin-film transistor TFT and the auxiliary thin-film transistor TFT' may be disposed on the buffer layer 111. The main thin-film transistor TFT may include a first semiconductor layer A1, a first gate electrode G1, a first source electrode S1, and a first drain electrode D1. The auxiliary thin-film transistor TFT' may include a second semiconductor layer A2, a second gate electrode G2, a second source electrode S2, and a second drain electrode D2. The main thin-film transistor TFT may be connected to the main organic light-emitting diode OLED and drive the main organic light-emitting diode OLED, and the auxiliary thin-film transistor TFT' may be connected to the auxiliary organic light-emitting diode OLED' and drive the auxiliary organic light-emitting diode OLED'.

According to an embodiment, the second semiconductor layer A2 may include the same material as that of the first semiconductor layer A1. According to an embodiment, the second semiconductor layer A2 may include a material different from that of the first semiconductor layer A1.

The second semiconductor layer A2 may overlap the bottom metal layer BML with the buffer layer 111 disposed therebetween. According to an embodiment, the width of the second semiconductor layer A2 may be less than the width of the bottom metal layer BML. Therefore, when projected in a direction substantially perpendicular to the substrate 100, the second semiconductor layer A2 may entirely overlap the bottom metal layer BML.

A first insulating layer 112 may cover the first semiconductor layer A1 and the second semiconductor layer A2. The first gate electrode G1 and the second gate electrode G2 may be disposed on the first insulating layer 112 to overlap the first semiconductor layer A1 and the second semiconductor layer A2, respectively.

A second insulating layer 113 may cover the first gate electrode G1 and the second gate electrode G2.

A first upper electrode CE2 of the main storage capacitor Cst and a second upper electrode CE2' of the auxiliary storage capacitor Cst' may be disposed on the second insulating layer 113.

In the first area 1A, the first upper electrode CE2 may overlap the first gate electrode G1 disposed therebelow. According to an embodiment, the first gate electrode G1 may be a first lower electrode CE1 of the main storage capacitor Cst. The first gate electrode G1 and the first upper electrode CE2 overlapping each other with the second insulating layer 113 disposed therebetween may constitute the main storage capacitor Cst. According to an embodiment, the first lower electrode CE1 of the main storage capacitor Cst may be provided as a separate element that is apart from the first gate electrode G1 of the main thin-film transistor TFT.

In the second area 2A, the second upper electrode CE2' may overlap the second gate electrode G2 disposed therebelow. According to an embodiment, the second gate electrode G2 may be a second lower electrode CE1' of the auxiliary storage capacitor Cst'. The second gate electrode G2 and the second upper electrode CE2' overlapping each other with the second insulating layer 113 disposed therebetween may constitute the auxiliary storage capacitor Cst'. According to an embodiment, the second lower electrode CE1' of the auxiliary storage capacitor Cst' may be provided as a separate element that is apart from the second gate electrode G2 of the auxiliary thin-film transistor TFT'.

A third insulating layer 115 may cover the first upper electrode CE2 and the second upper electrode CE2'.

The first insulating layer 112, the second insulating layer 113, and the third insulating layer 115 may be collectively referred to as an inorganic insulating layer IL. The inorganic insulating layer IL may have a second hole H2 corresponding to the transmission area TA. The second hole H2 defined in the inorganic insulating layer IL may expose at least a portion of the upper surface of the substrate 100. For example, the second hole H2 defined in the inorganic insulating layer IL may expose a portion of the upper surface of the second barrier layer 104. According to an embodiment, when the buffer layer 111 is disposed on the transmission area TA, the second hole H2 defined in the inorganic insulating layer IL may expose at least a portion of the upper surface of the buffer layer 111.

Because the inorganic insulating layer IL has the second hole H2 corresponding to the transmission area TA, the light transmittance of the transmission area TA and/or the second area 2A may be increased.

The second hole H2 is defined by overlapping an opening of the first insulating layer 112, an opening of the second insulating layer 113, and an opening of the third insulating layer 115, which are formed to correspond to the transmission area TA. These openings may be formed through separate processes, or may be formed simultaneously through the same process. When these openings are formed through separate processes, the inner surface of the second hole H2 may not be smooth and may have a height difference such as a stair shape.

A data line DL, the source electrodes S1 and S2, and the drain electrodes D1 and D2 may be disposed on the third insulating layer 115.

A planarization layer 117 may cover the data line DL, the source electrodes S1 and S2, and the drain electrodes D1 and D2. The planarization layer 117 may have a substantially flat upper surface so that the first pixel electrode 121 and the second pixel electrode 121' thereon may be formed to be substantially flat. According to an embodiment, the planarization layer 117 may include a first planarization layer and a second planarization layer.

The planarization layer 117 may have a third hole H3 corresponding to the transmission area TA. The third hole H3 defined in the planarization layer 117 may overlap the first hole H1 defined in the buffer layer 111 and the second hole H2 defined in the inorganic insulating layer IL. According to an embodiment, the third hole H3 defined in the planarization layer 117 may be greater than the first hole H1 and the second hole H2. According to an embodiment, the planarization layer 117 covers the edge of the second hole H2 of the inorganic insulating layer IL, so that the area of the third hole H3 is less than the area of the second hole H2.

The planarization layer 117 may have a via hole exposing one of the first source electrode S1 or the first drain electrode D1 of the main thin-film transistor TFT, and the first pixel electrode 121 may be in contact (e.g., direct contact) with the first source electrode S1 or the first drain electrode D1 through the via hole, and may be electrically connected to the main thin-film transistor TFT.

The planarization layer 117 has a via hole exposing one of the second source electrode S2 or the second drain electrode D2 of the auxiliary thin-film transistor TFT', and the second pixel electrode 121' may be in contact (e.g., direct contact) with the second source electrode S2 or the second drain electrode D2 through the via hole, and may be electrically connected to the auxiliary thin-film transistor TFT'.

The main organic light-emitting diode OLED and the auxiliary organic light-emitting diode OLED' may be disposed on the planarization layer 117.

A first pixel electrode 121 and a second pixel electrode 121' may be disposed on the planarization layer 117. According to an embodiment, the first pixel electrode 121 and the second pixel electrode 121' may include the same material. According to an embodiment, the first pixel electrode 121 and the second pixel electrode 121' may include different materials from each other.

A pixel defining layer 119 may be disposed on the first pixel electrode 121 and the second pixel electrode 121'. The pixel defining layer 119 may be disposed on the first pixel electrode 121 and the second pixel electrode 121' and may include a first opening OP1 and a second opening OP2 exposing at least a portion of the first pixel electrode 121 and at least a portion of the second pixel electrode 121', respectively. The emission areas of the main organic light-emitting diode OLED and the auxiliary organic light-emitting diode OLED', that is, the sizes and shapes of the main pixel Pm and the auxiliary pixel Pa, may be defined by the first opening OP1 and the second opening OP2 defined by the pixel defining layer 119.

The pixel defining layer 119 may prevent an electric arc or the like from occurring on the edge of the first and second pixel electrodes 121 and 121' by increasing the distance between the edges of the first and second pixel electrodes 121 and 121' and the opposite electrode 123 on the first and second pixel electrodes 121 and 121'. According to an embodiment, a spacer may be further provided on the pixel defining layer 119.

The pixel defining layer 119 may have a fourth hole H4 corresponding to the transmission area TA. The fourth hole H4 defined in the pixel defining layer 119 may overlap the first hole H1 defined in the buffer layer 111, the second hole H2 defined in the inorganic insulating layer IL, and the third hole H3 defined in the planarization layer 117. The light transmittance of the transmission area TA may be increased by the first to fourth holes H1 to H4 corresponding to the transmission area TA.

A first emission layer 122b and a second emission layer 122b' corresponding to the first pixel electrode 121 and the second pixel electrode 121', respectively, may be disposed in the first opening OP1 and the second opening OP2 of the pixel defining layer 119. The first emission layer 122b and the second emission layer 122b' may include a high molecular weight organic material or a low molecular weight organic material, and may emit red light, green light, blue light, or white light.

An organic functional layer 122e may be disposed above and/or below the first emission layer 122b and the second emission layer 122b'. The organic functional layer 122e may include a first functional layer 122a and/or a second functional layer 122c. In an embodiment, the first functional layer 122a and/or the second functional layer 122c may be omitted.

According to an embodiment, at least a portion of the first functional layer 122a may be disposed on the inner surfaces of the second hole H2 defined in the inorganic insulating layer IL, the third hole H3 defined in the planarization layer 117, and the fourth hole H4 defined in the pixel defining layer 119.

The second functional layer 122c may be disposed above the first emission layer 122b and the second emission layer 122b'. The second functional layer 122c may include a single layer or multiple layers including an organic material.

According to an embodiment, at least a portion of the second functional layer 122c may be disposed on the inner surfaces of the second hole H2 defined in the inorganic insulating layer IL, the third hole H3 defined in the planarization layer 117, and the fourth hole H4 defined in the pixel defining layer 119.

The opposite electrode 123 may be disposed on the second functional layer 122c. The opposite electrode 123 may be disposed on the first pixel electrode 121 and the second pixel electrode 121'. The opposite electrode 123 may be integrally provided to cover the first pixel electrode 121 and the second pixel electrode 121'. For example, in an embodiment, the opposite electrode 123 extends from the first area 1A to the second area 2A and covers the second pixel electrode 121'.

The opposite electrode 123 may have a fifth hole H5 corresponding to the transmission area TA. The light transmittance of the transmission area TA or the second area 2A may be increased by the fifth hole H5 defined in the opposite electrode 123.

According to an embodiment, at least a portion of the opposite electrode 123 may be disposed on the inner surfaces of the second hole H2 defined in the inorganic insulating layer IL, the third hole H3 defined in the planarization layer 117, and the fourth hole H4 defined in the pixel defining layer 119.

According to an embodiment, the opposite electrode 123 having the fifth hole H5 may be formed by depositing a material forming the opposite electrode 123 on the entire surface of the substrate 100 and removing a portion corresponding to the transmission area TA through a laser lift-off process. For example, after the organic functional layer 122e and the opposite electrode 123 are entirely deposited on a sacrificial layer, the organic functional layer 122e and the opposite electrode 123 corresponding to the transmission area TA may be removed through a laser by using the bottom metal layer BML on the second area 2A as a mask. Because the portion corresponding to the transmission area TA in the opposite electrode 123 entirely deposited on the substrate 100 is removed, the fifth hole H5 corresponding to the transmission area TA may be defined in the opposite electrode 123.

According to an embodiment, because the organic functional layer 122e and the opposite electrode 123 that are entirely deposited on the substrate 100 are removed together by a laser, an end 122ea of the organic functional layer 122e and an end 123c of the opposite electrode 123 may coincide with each other in the vertical direction of the substrate 100. In the vertical direction of the substrate 100, an end 122aa of the first functional layer 122a, an end 122ca of the second functional layer 122c, and the end 123c of the opposite electrode 123 may coincide with each other.

According to an embodiment, an upper layer may be disposed on the opposite electrode 123. The upper layer may protect the opposite electrode 123 and increase light extraction efficiency.

When the upper layer is provided on the opposite electrode 123, the upper layer may also be deposited on the entire surface of the substrate 100, and then, the upper layer formed on the transmission area TA may be removed by a laser lift-off process. In this case, the end of the upper layer in the vertical direction of the substrate 100 may coincide with the end 123c of the opposite electrode 123.

A thin-film encapsulation layer 300 may be disposed on the main organic light-emitting diode OLED and the auxiliary organic light-emitting diode OLED' of the display apparatus 1, and may serve as a sealing member. That is, the main organic light-emitting diode OLED and the auxiliary organic light-emitting diode OLED' may be sealed by the thin-film encapsulation layer 300. The thin-film encapsulation layer 300 may be disposed on the opposite electrode 123. The thin-film encapsulation layer 300 may prevent or reduce infiltration of foreign matter or external moisture into the main organic light-emitting diode OLED and the auxiliary organic light-emitting diode OLED'.

The thin-film encapsulation layer 300 may include at least one inorganic layer and at least one organic layer. In this regard, FIG. 17 illustrates that the thin-film encapsulation layer 300 has a structure in which a first inorganic layer 131, an organic layer 132, and a second inorganic layer 133 are sequentially stacked. According to an embodiment, the number of inorganic layers, the number of organic layers, and the stacking order may be changed.

The first inorganic layer 131, the organic layer 132, and the second inorganic layer 133 may be integrally formed with each other to cover the first area 1A and the second area 2A. Therefore, the first inorganic layer 131, the organic layer 132, and the second inorganic layer 133 may be disposed in the first hole H1 defined in the buffer layer 111, the second hole H2 defined in the inorganic insulating layer IL, the third hole H3 defined in the planarization layer 117, and the fourth hole H4 defined in the pixel defining layer 119.

The thin-film encapsulation layer 300 may cover the end 122ea of the organic functional layer 122e and the end 123c of the opposite electrode 123. For example, the first inorganic layer 131 of the thin-film encapsulation layer 300 may cover the end 122aa of the first functional layer 122a, the end 122ca of the second functional layer 122c, and the end 123c of the opposite electrode 123. According to an embodiment, when the upper layer is provided on the opposite electrode 123, the first inorganic layer 131 may cover the end of the upper layer.

However, when the organic functional layer 122e and the opposite electrode 123 are entirely deposited on the sacrificial layer, and then a laser lift-off process is performed to remove the organic functional layer 122e and the opposite electrode 123 corresponding to the transmission area TA through a laser by using the bottom metal layer BML on the second area 2A as a mask, the edge portion 123d of the opposite electrode 123 adjacent to the end 123c of the opposite electrode 123 may have an irregular shape. For example, a burr may be formed in the edge portion 123d of the opposite electrode 123 during the laser lift-off process. The burr formed in the edge portion 123d of the opposite electrode 123 may extend in an oblique direction away from the upper surface of the substrate 100, and the cross-section thereof may have an irregular unevenness.

According to an embodiment, the opposite electrode 123 is provided in the structure as described above with reference to FIGS. 13 to 16, the bendability of the opposite electrode 123 may be increased, and the formation of a burr in the edge portion 123d of the opposite electrode 123 during the laser lift-off process may be prevented or reduced. Further, according to an embodiment, oxidation of the opposite electrode 123 due to infiltration of moisture or the like may be prevented or reduced, and the bendability of the display panel and/or the display apparatus 1 may be increased.

As described above, the display panel and the display apparatus including the same, according to embodiments of the present disclosure, may prevent or reduce moisture infiltration and the occurrence of cracks. However, the scope of embodiments of the disclosure is not limited by such an effect.

While the present disclosure has been particularly shown and described with reference to the embodiments thereof, it will be understood by those of ordinary skill in the art that various changes in form and detail may be made therein without departing from the spirit and scope of the present disclosure as defined by the following claims.

What is claimed is:

1. A display panel, comprising:
   a substrate,
   wherein the display panel comprises a first area;
   a first pixel electrode disposed in the first area; and
   an opposite electrode disposed on the first pixel electrode,
   wherein the opposite electrode comprises a first layer including only a first material and a second layer including an alloy including the first material,
   wherein the alloy further includes a second material, wherein an amount of the second material in the second layer gradually increases or decreases from a bottom of the second layer to a top of the second layer.

2. The display panel of claim 1, wherein the opposite electrode has a thickness of about 50 Å to about 150 Å.

3. The display panel of claim 2, wherein a thickness of the first layer is about 1/10 to about 4/5 of the thickness of the opposite electrode.

4. The display panel of claim 3, wherein a thickness of the second layer is about 1/5 to about 9/10 of the thickness of the opposite electrode.

5. The display panel of claim 3, wherein an amount of the second material is about 5% to about 40% of a total amount of the second layer.

6. The display panel of claim 5, wherein a ductility of the first material is greater than a ductility of the second material, and a brittleness of the second material is greater than a brittleness of the first material.

7. The display panel of claim 6, wherein the first layer is closer to the substrate than the second layer is to the substrate.

8. The display panel of claim 6, wherein the second layer is closer to the substrate than the first layer is to the substrate.

9. The display panel of claim 1, further comprising:
a third area of the display panel disposed between the first area and a second area of the display panel, wherein a through hole is defined in the second area.

10. The display panel of claim 9, wherein the opposite electrode extends from the first area to the third area.

11. A display panel, comprising:
a substrate,
wherein the display panel comprises a first area;
a first pixel electrode disposed in the first area;
an opposite electrode disposed on the first pixel electrode,
wherein the opposite electrode comprises a first layer including only a first material and a second layer including an alloy including the first material,
wherein the alloy further includes a second material,
wherein an amount of the second material in the second layer gradually increases or decreases from a bottom of the second layer to a top of the second layer; and
a second pixel electrode disposed in a second area of the display panel,
wherein the opposite electrode extends from the first area to the second area and covers the second pixel electrode.

12. The display panel of claim 11, further comprising:
a bottom metal layer disposed between the substrate and the opposite electrode in the second area.

13. The display panel of claim 12, wherein the second area comprises a transmission area, and the bottom metal layer comprises a lower hole corresponding to the transmission area.

14. The display panel of claim 13, wherein the opposite electrode comprises a hole corresponding to the transmission area.

15. The display panel of claim 11, further comprising:
an organic functional layer disposed between the second pixel electrode and the opposite electrode; and
a thin-film encapsulation layer disposed on the opposite electrode.

16. A display apparatus, comprising:
a display panel including a first area and a second area; and
a component disposed below the second area of the display panel,
wherein the display panel comprises:
a substrate;
a first pixel electrode disposed in the first area; and
an opposite electrode disposed on the first pixel electrode,
wherein the opposite electrode comprises a first layer including only a first material and a second layer including an alloy including the first material,
wherein the alloy further includes a second material, and an amount of the second material in the second layer gradually increases or decreases from a bottom of the second layer to a top of the second layer.

17. The display apparatus of claim 16, wherein the opposite electrode has a thickness of about 50 Å to about 150 Å.

18. The display apparatus of claim 16, wherein a thickness of the first layer is about 1/10 to about 4/5 of a thickness of the opposite electrode.

19. The display apparatus of claim 16, wherein a thickness of the second layer is about 1/5 to about 9/10 of a thickness of the opposite electrode.

20. The display apparatus of claim 16, wherein an amount of the second material is about 5% to about 40% of a total amount of the second layer.

21. The display apparatus of claim 20, wherein a ductility of the first material is greater than a ductility of the second material, and a brittleness of the second material is greater than a brittleness of the first material.

22. The display apparatus of claim 16, further comprising:
a third area of the display panel disposed between the first area and the second area, wherein a through hole is defined in the second area.

23. The display apparatus of claim 16, wherein the component comprises an imaging element or a sensor.

* * * * *